(12) United States Patent
Takahashi et al.

(10) Patent No.: US 7,211,295 B2
(45) Date of Patent: *May 1, 2007

(54) SILICON DIOXIDE FILM FORMING METHOD

(75) Inventors: Yutaka Takahashi, Esashi (JP); Hitoshi Kato, Esashi (JP); Katsutoshi Ishii, Shiroyama-Machi (JP); Kazutoshi Miura, Shiroyama-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 8 days.

This patent is subject to a terminal disclaimer.

(21) Appl. No.: 10/830,317

(22) Filed: Apr. 23, 2004

(65) Prior Publication Data

US 2004/0194707 A1 Oct. 7, 2004

Related U.S. Application Data

(62) Division of application No. 09/864,374, filed on May 25, 2001, now Pat. No. 6,884,295.

(30) Foreign Application Priority Data

| May 29, 2000 | (JP) | ............................ 2000-157879 |
| May 31, 2000 | (JP) | ............................ 2000-162950 |
| Jun. 23, 2000 | (JP) | ............................ 2000-189434 |
| Jul. 25, 2000 | (JP) | ............................ 2000-223235 |

(51) Int. Cl.
*C23C 16/40* (2006.01)

(52) U.S. Cl. ........................... 427/255.29; 427/255.37; 427/255.393

(58) Field of Classification Search ........... 427/255.29, 427/255.37, 579, 255.27, 255.26, 255.393
See application file for complete search history.

(56) References Cited

U.S. PATENT DOCUMENTS

| 3,934,117 | A | | 1/1976 | Schladitz |
| 4,123,564 | A | * | 10/1978 | Ajima et al. ................. 438/448 |
| 4,155,802 | A | * | 5/1979 | Yonezawa et al. ........... 438/362 |
| 4,231,809 | A | * | 11/1980 | Schmidt ....................... 438/477 |
| 4,349,408 | A | * | 9/1982 | Tarng et al. ................. 438/582 |
| 4,420,497 | A | * | 12/1983 | Tickle ......................... 438/466 |
| 4,518,630 | A | * | 5/1985 | Grasser ....................... 438/774 |
| 4,544,416 | A | * | 10/1985 | Meador et al. ............. 438/477 |
| 4,566,173 | A | * | 1/1986 | Gossler et al. .............. 438/762 |
| 4,693,925 | A | * | 9/1987 | Cheung et al. ............. 428/189 |
| 4,784,975 | A | * | 11/1988 | Hofmann et al. ........... 438/308 |
| 4,826,709 | A | * | 5/1989 | Ryan et al. ................. 438/782 |
| 5,225,378 | A | | 7/1993 | Ushikawa |
| 5,234,501 | A | | 8/1993 | Nakao et al. |
| 5,318,920 | A | * | 6/1994 | Hayashide .................. 438/398 |
| 5,331,134 | A | | 7/1994 | Kimura |
| 5,443,998 | A | * | 8/1995 | Meyer ......................... 438/439 |
| 5,631,199 | A | | 5/1997 | Park |
| 5,633,212 | A | | 5/1997 | Yuuki |
| 5,669,768 | A | | 9/1997 | Lin et al. |
| 5,693,578 | A | * | 12/1997 | Nakanishi et al. .......... 438/770 |
| 5,777,300 | A | | 7/1998 | Homma et al. |
| 5,810,929 | A | | 9/1998 | Yuuki |
| 5,861,190 | A | | 1/1999 | Greene et al. |
| 6,031,205 | A | | 2/2000 | Shimazu |
| 6,037,273 | A | * | 3/2000 | Gronet et al. ................ 438/773 |
| 6,221,791 | B1 | | 4/2001 | Wang et al. |
| 6,239,044 | B1 | | 5/2001 | Kashiwagi et al. |
| 6,281,141 | B1 | | 8/2001 | Das et al. |
| 6,287,984 | B1 | | 9/2001 | Horie |
| 6,335,295 | B1 | | 1/2002 | Patel |
| 6,369,361 | B2 | | 4/2002 | Saito et al. |
| 6,391,738 | B2 | | 5/2002 | Moore |
| 6,440,382 | B1 | * | 8/2002 | Powell ..................... 423/580.1 |
| 6,516,143 | B2 | | 2/2003 | Toya et al. |
| 6,540,509 | B2 | * | 4/2003 | Asano et al. ............... 432/205 |
| 6,541,278 | B2 | * | 4/2003 | Morita et al. ................... 438/3 |
| 6,589,349 | B2 | * | 7/2003 | Kashiwagi et al. ......... 118/708 |
| 6,797,323 | B1 | * | 9/2004 | Kashiwagi et al. .... 427/255.29 |
| 6,863,732 | B2 | * | 3/2005 | Asano et al. ............... 118/715 |
| 6,903,030 | B2 | * | 6/2005 | Ishii et al. .................. 438/782 |
| 2001/0041462 | A1 | | 11/2001 | Kashiwagi et al. |
| 2001/0046792 | A1 | | 11/2001 | Takahashi et al. |
| 2001/0049080 | A1 | | 12/2001 | Asano et al. |
| 2002/0119327 | A1 | * | 8/2002 | Arkles et al. ............... 428/446 |
| 2003/0106495 | A1 | | 6/2003 | Asano et al. |

FOREIGN PATENT DOCUMENTS

| DE | 39 33 423 | 4/1991 |
| EP | 0 798 769 | 10/1997 |
| EP | 0 872 878 | 10/1998 |
| GB | 2 291 171 | 1/1996 |
| JP | 62-089364 | 4/1987 |
| JP | 63-017544 | 1/1988 |
| JP | 64-069056 | 3/1989 |
| JP | 4-27136 | 1/1992 |
| JP | 5-335250 | 12/1993 |
| JP | 08-227883 | 9/1996 |
| JP | 10-060649 | 3/1998 |
| JP | 11-186248 | 7/1999 |
| JP | 11-204511 | 7/1999 |
| JP | 2000-058532 | 2/2000 |
| JP | 2000-208500 | 7/2000 |
| JP | 2001-345316 | 12/2001 |
| WO | WO 00/48240 | 8/2000 |

* cited by examiner

*Primary Examiner*—Bret Chen
(74) *Attorney, Agent, or Firm*—Smith, Gambrell & Russell, LLP

(57) ABSTRACT

Disclosed herein is a silicon dioxide film forming method including: a reaction chamber heating step of heating a reaction chamber to a predetermined temperature, the reaction chamber containing an object to be processed; a gas pretreating step of energizing a process gas to produce water, the process gas including hydrogen, chlorine, and oxygen gas; and a film forming step of forming a silicon dioxide film by supplying the the process gas that has been energized to produce water into the heated reaction chamber to oxidize the silicon layer of the object to be processed.

4 Claims, 12 Drawing Sheets

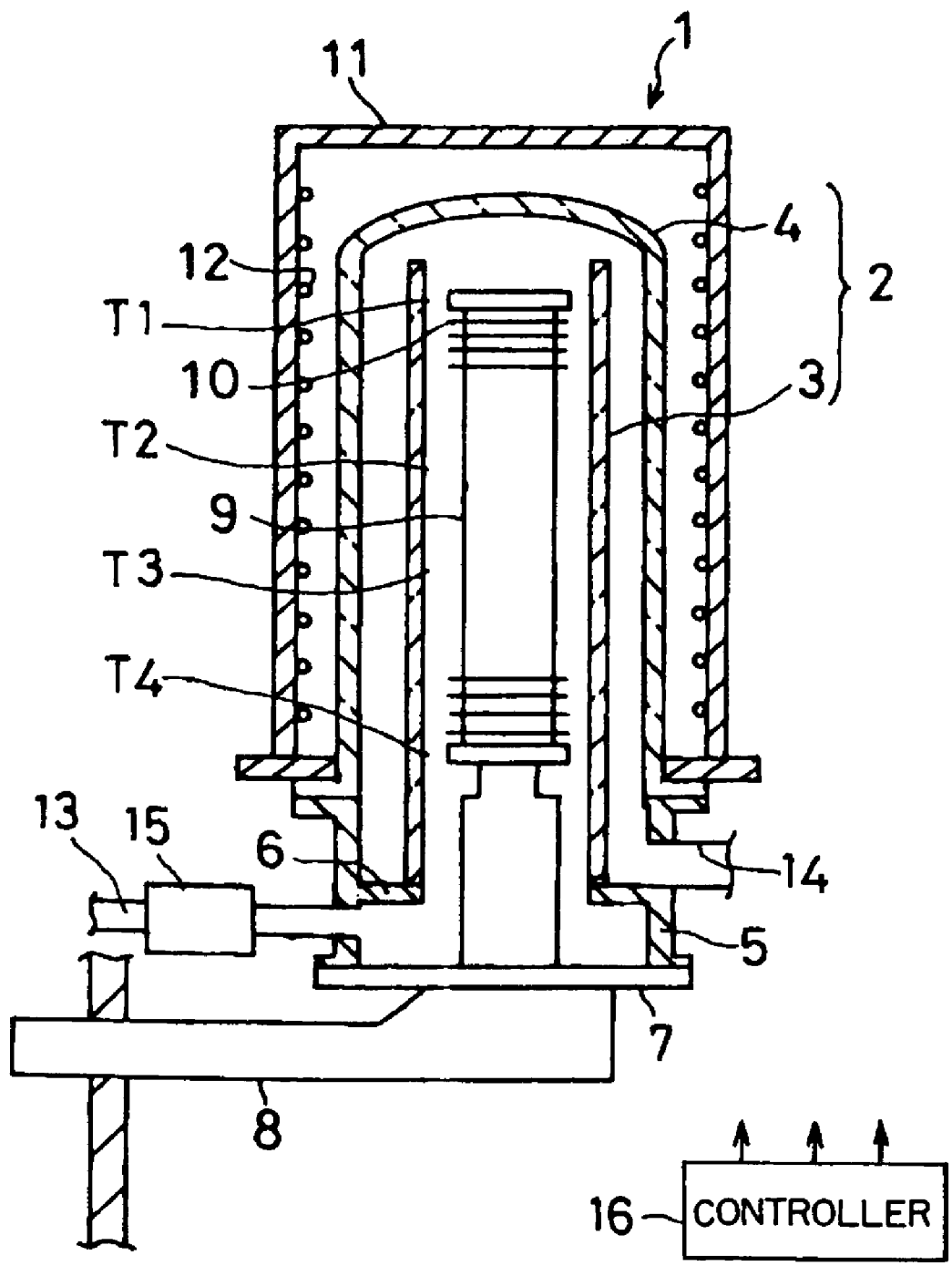
F I G. 1

| TEMPERATURE OF HEATING UNIT \ COMPONENT | $N_2O$ | $N_2$ | $O_2$ | $NO$ | $NO_2$ |
|---|---|---|---|---|---|
| 1000 °C | 1 | 47 | 19 | 0.3 | 3.0 |
| 900 °C | 8 | 40 | 17 | 0.2 | 2.0 |
| 750 °C | 54 | 28 | 13 | 0.05 | 0.5 |

| | FILM THICKNESS | Peak N VOLUME |
|---|---|---|
| EMBODIMENT | 2.00 nm | 2.24 atomic % |
| COMPARATIVE EXAMPLE 1 | 3.36 nm | 2.33 atomic % |
| COMPARATIVE EXAMPLE 2 | 2.00 nm | 0.87 atomic % |

FIG. 3

| | T1 | T2 | T3 | T4 |
|---|---|---|---|---|
| EMBODIMENT | 798.6 | 800.2 | 800.1 | 802.6 |
| COMPARATIVE EXAMPLE 3 | 798.4 | 800.1 | 799.9 | 801.8 |

| PROCESSING CONDITION | TEMPERATURE OF REACTION TUBE | 750 °C | 800 °C | 850 °C |
|---|---|---|---|---|
| HEATING UNIT 900 °C | THICKNESS INCREMENT | 0.29 | 0.50 | 0.90 |
| REACTION TIME 15 MIN | PEAK N VOLUME | 0.55 | 1.05 | 1.53 |
| HEATING UNIT 1000 °C | THICKNESS INCREMENT | 0.28 | 0.47 | 0.88 |
| REACTION TIME 15 MIN | PEAK N VOLUME | 1.13 | 1.24 | 1.66 |
| HEATING UNIT 1000 °C | THICKNESS INCREMENT | 0.36 | 0.75 | 1.09 |
| REACTION TIME 30 MIN | PEAK N VOLUME | 0.78 | 1.72 | 1.83 |
| HEATING UNIT NOT HEATED | THICKNESS INCREMENT | 0.30 | 0.54 | 1.01 |
| REACTION TIME 15 MIN | PEAK N VOLUME | 0.21 | 0.36 | 0.52 |

( THICKNESS INCREMENT : nm, PEAK N VOLUME : atomic % )

FIG. 5

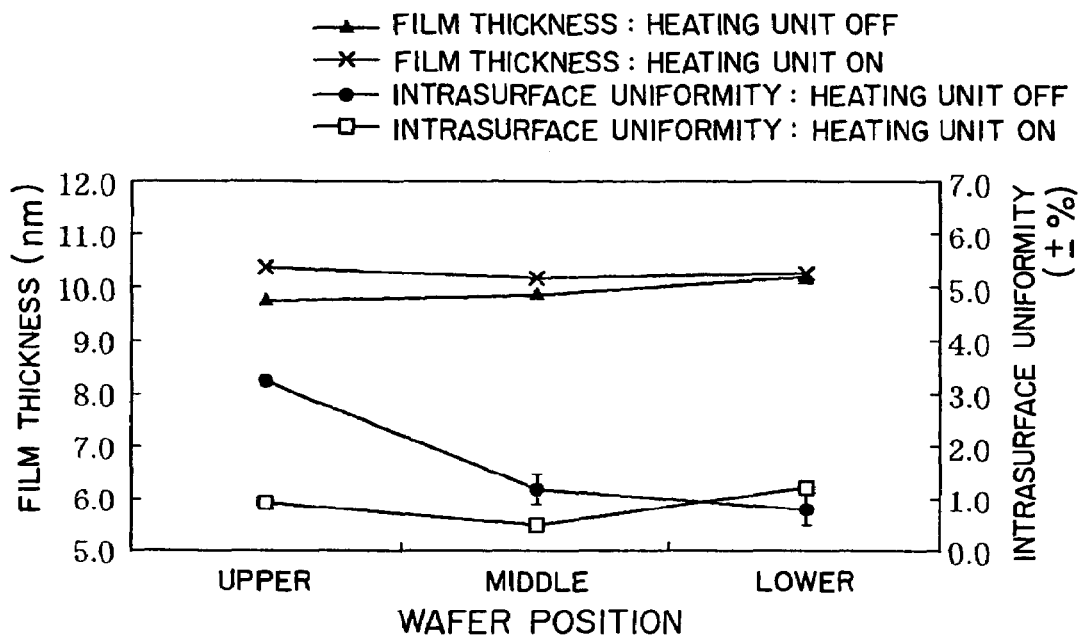
F I G. 9
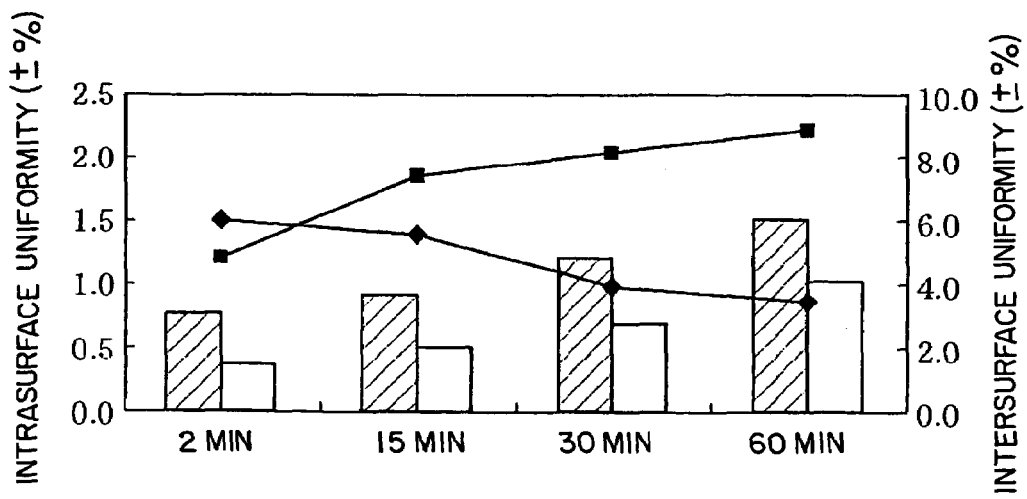
F I G. 10

| Test No. | HEATING UNIT | ANALYSIS STARTING TIME (min) | $H_2$ DENSITY (ppm) |
|---|---|---|---|
| ① | ON | 30 | <5 |
| ② | | 50 | <5 |
| ③ | OFF | 30 | 23 |
| ④ | | 50 | 78 |
| ⑤ | | 70 | 24 |
F I G. 11
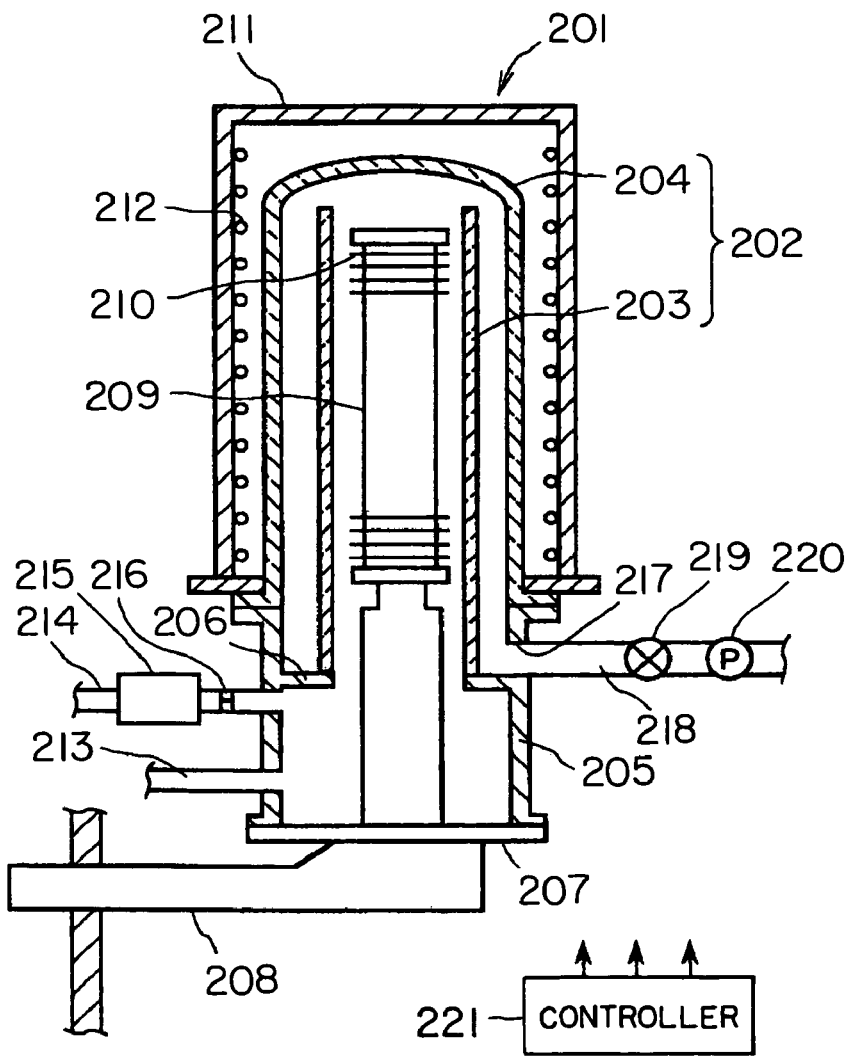
F I G. 12

| | TEMPERATURE OF REACTION TUBE | D/R | R I |
|---|---|---|---|
| EMBODIMENT | 550 °C | 0.70 nm/min | 2.0 |
| COMPARATIVE EXAMPLE | 550 °C | 0.27 nm/min | 2.9 |

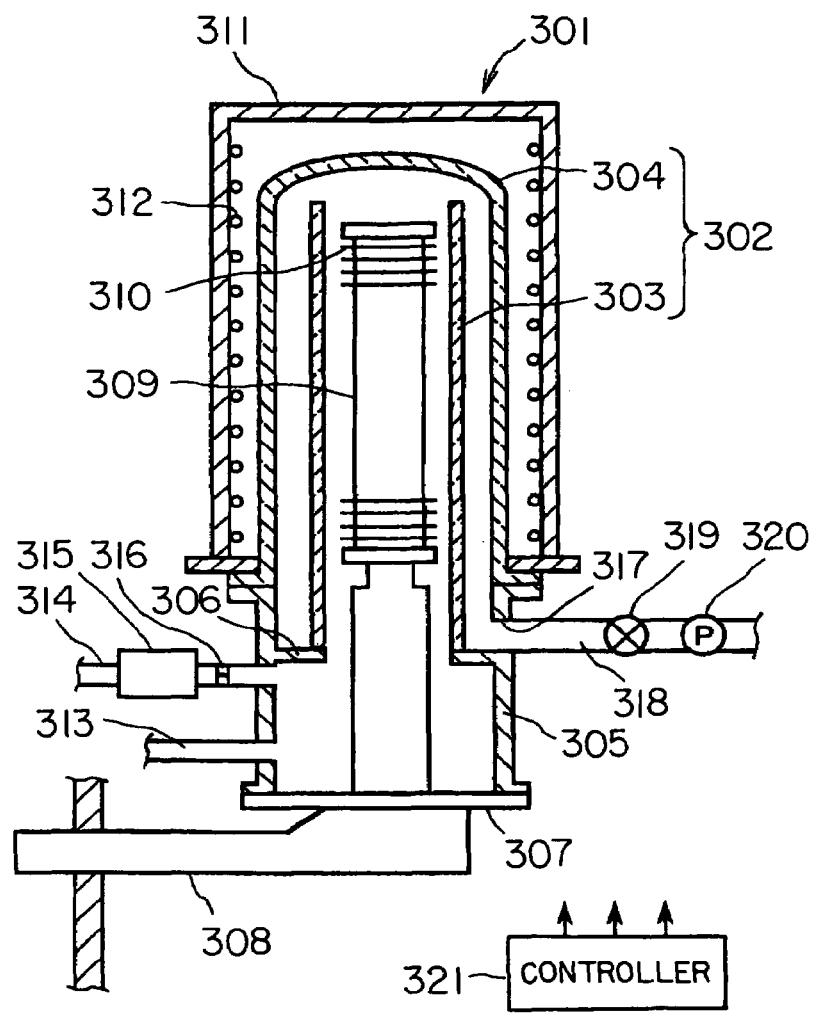
F I G. 15
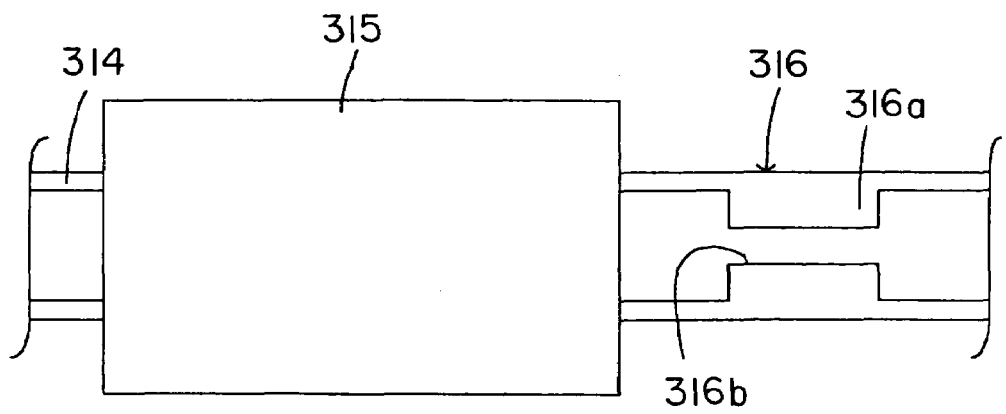
F I G. 16

| TEMPERATURE OF HEATING UNIT | OXYGEN CONCENTRATION |
|---|---|
| 600°C | 5% |
| 700°C | 11% |
| 750°C | 13% |
| 800°C | 14% |
| 900°C | 17% |
| 950°C | 19% |
| 1000°C | 19% |

F I G. 17

| TEMPERATURE OF HEATING UNIT | FILM FORMING RATE |
|---|---|
| NOT HEATED | 0.07 nm/min |
| 500°C | 0.07 nm/min |
| 600°C | 0.08 nm/min |
| 700°C | 0.14 nm/min |
| 750°C | 0.27 nm/min |
| 800°C | 0.48 nm/min |
| 900°C | 0.72 nm/min |
| 950°C | 0.78 nm/min |
| 1000°C | 0.78 nm/min |

F I G. 18

SILICON DIOXIDE FILM FORMING METHOD

CROSS REFERENCE TO RELATED APPLICATION

This application is a division of application Ser. No. 09/864,374, filed May 25, 2001, issued as U.S. Pat. No. 6,884,295 on Apr. 26, 2005, which is incorporated herein by reference in its entirety.

BACKGROUND OF THE INVENTION

1. Field of the Invention

The present invention relates to a method of forming an oxynitride film or the like and a system for carrying out the same. More specifically, the present invention relates to a method of forming an oxynitride film or the like on an object to be processed, such as a semiconductor wafer, and a system for carrying out the same.

2. Description of the Related Art

A semiconductor device fabricating process forms an insulating film on an object to be processed, such as a semiconductor wafer. This insulating film is used, for example, as a mask for impurity diffusion or ion implantation or as a source of an impurity. A silicon oxynitride film is used occasionally as such an insulating film. Silicon oxynitride films, as compared with prevalently used silicon oxide films, have a high dielectric constant and have a high capability of preventing penetration by an impurity, such as boron.

A silicon oxynitride film is formed on a surface of a semiconductor wafer by, for example, subjecting a semiconductor wafer to a thermal process. This thermal process will be described. A semiconductor wafer, such as a silicon wafer, is placed in a thermal processing device. The semiconductor wafer is heated to a high temperature of, for example, 900° C. Then, a process gas, such as dinitrogen oxide gas ($N_2O$ gas) is supplied into the thermal processing device for a predetermined time to form a silicon oxynitride film on the surface of the semiconductor wafer.

The progressive miniaturization of semiconductor devices requires reduction of thickness of silicon oxynitride films. Generally, it is preferable to lower the process temperature in the thermal processing device to form silicon oxynitride films of a small thickness, because the lowering of the process temperature is effective in reducing oxidation rate.

However, if the process temperature is lowered, for example, from 900° C. to 800° C. or 750° C., nitrogen gas cannot satisfactorily be pyrolyzed and, consequently, it is difficult to form an oxynitride film having a desired nitrogen content.

Methods of forming a silicon oxide film ($SiO_2$ film) on each of a plurality of semiconductor wafers (hereinafter referred to simply as "wafers") placed in a batch-processing furnace by oxidizing a silicon film on each wafer are classified into: dry oxidation methods that use oxygen gas ($O_2$ gas) and hydrogen chloride gas (HCl gas); and wet oxidation methods that produce steam by burning oxygen gas and hydrogen gas ($H_2$ gas) by an external device and that supply the steam and oxygen gas into a reaction tube. A suitable oxidation method is selected according to desired film quality.

The dry oxidation methods oxidize a silicon film with oxygen gas and remove impurities from the surface of the wafer by means of gettering-effect of chloride. More concretely, a wafer boat holding a plurality of wafers in a tier-like manner is carried into a vertical reaction tube, a process atmosphere in the reaction tube is heated by a heater surrounding the reaction tube, a process gas of an ordinary temperature including oxygen gas and hydrogen chloride gas is supplied through a ceiling part of the reaction tube into the reaction tube, and the process atmosphere is exhausted through a lower part of the reaction tube.

Higher process temperatures are more apt to produce a defect called a slip. In addition, it is preferable to avoid thermally affecting underlying films and to reduce energy consumption. Therefore, various studies have been made to reduce process temperature.

Since a diameter of the wafer is increasing progressively, thickness uniformity of a film formed on the surface of the wafer, i.e., intrasurface thickness uniformity becomes worse when the process temperature is reduced. In addition, thickness difference between films formed on the surfaces of the wafers, i.e., interwafer thickness uniformity also becomes worse.

It has been found, through examinations of relation between the position of a wafer on a wafer boat and the thickness of a film formed on the same wafer, that the thickness uniformity of films formed on wafers held in an upper part of the wafer boat is worse than that of films formed on wafers held in a lower part of the wafer boat. The inventors of the present invention infer that dependence of thickness uniformity on the position of the wafer on the wafer boat is due to the following reasons. FIGS. 19A to 19C show typically a flow of a gas over a wafer W, a temperature of the wafer W and a thickness of a film formed on the wafer W, respectively. Oxygen gas and hydrogen chloride gas flow from a periphery (edge) of the wafer W toward a center of the same. Then, oxygen gas oxidizes silicon on the wafer W as the same flows along the surface of the wafer W. Since the wafer W dissipates heat through a peripheral part thereof, the temperature of the wafer W increases toward the center of the wafer W. High temperature promotes the oxidation, and hence silicon on a central part of the wafer W is oxidized at an oxidation rate higher than that at which silicon on a peripheral part of the wafer W is oxidized. Consequently, even if the film is formed in a highly uniform thickness, there is a tendency for a part of the film on a central part of the wafer W to be thicker than a part of the same on a peripheral part of the wafer W.

Although it is only a small amount, interaction between hydrogen, which has been produced through decomposition of hydrogen chloride, and oxygen produces steam. The gas around an upper part of the wafer boat is not heated sufficiently. Thus, the temperature of the gas rises as the same flows from the periphery toward the center of the wafer W. Consequently, the amount of steam produced around the center of the wafer W is greater than that of steam produced around the periphery of the wafer W. The steam is effective in increasing the oxide film. Thus, the difference between the amount of steam produced around the peripheral part of the wafer W and that of steam produced around the central part of the wafer W greatly affects the difference between the thickness of a part of the film formed on the peripheral part of the wafer W and that of a part of the film formed on the central part of the wafer W. Consequently, the thickness of the part of the film on the central part of the wafer W is further increased so that the thickness of the film formed on the wafer W has a distribution of an upward convex curve, that is, the uniformity of the film thickness becomes worse. Since the temperature of the gas increases as the gas flows toward the lower part of the reaction tube, the above steam generating reaction is substantially equilibrated around the lower part of the wafer boat. That is, the gas is decomposed completely and all the possible amount of steam is produced before the gas flows along the wafers W. Therefore, substantially the same amount of steam exists around the peripheral part of the wafer W and around the central part of the wafer W as the process gas flows from the periphery toward the center of the wafer W and, consequently, the film is formed in a highly uniform thickness. Thus, it is inferred that the uniformity of the thickness of the films formed on the wafers held in the upper part of the wafer boat is considerably bad, and the difference between the thickness of the films formed on the wafers held in the upper part of the wafer boat and that of the films formed on the wafers held in the lower part of the wafer boat is great. Accordingly, it is difficult to lower the process temperature at the present.

A semiconductor device fabricating apparatus forms a thin silicon nitride film on an object to be processed, such as a semiconductor wafer. The silicon nitride film is excellent in insulating performance and corrosion resistance, and is used prevalently as an insulating film, as a means for impurity diffusion and as a mask for ion implantation. The silicon nitride film is formed on a semiconductor wafer by, for example, a CVD process (chemical vapor deposition process).

When forming a silicon nitride film on a semiconductor wafer, such as a silicon wafer, by the CVD process, the semiconductor wafer is placed in a thermal processing apparatus. Subsequently, an interior of the thermal processing apparatus is evacuated to a predetermined pressure of, for example, 133 Pa (1 Torr), and is heated to a predetermined temperature in a range of, for example, 650 to 700° C. Then, process gases, such as dichlorosilane gas ($SiH_2Cl_2$ gas) and ammonia gas ($NH_3$ gas), are supplied into the thermal processing apparatus for a predetermined time in order to deposit a silicon nitride film on a surface of the semiconductor wafer.

The silicon nitride film thus formed has a refractive index RI=2.0 and has a substantially stoichiometric composition.

When forming the silicon nitride film, it is desired to use a low process temperature. However, ammonia cannot be satisfactorily decomposed and the silicon nitride film cannot be satisfactorily deposited if the process temperature is as low as 600° C., because ammonia has a high decomposition temperature. The inventors made various studies to use trimethylamine (TMA) having a decomposition temperature lower than that of ammonia, instead of ammonia, as a source of nitrogen.

A silicon nitride film formed on a semiconductor wafer by using a process temperature of for example 550° C. and trimethylamine as a source of nitrogen had an RI=2.9, which proved that the silicon nitride film was not satisfactorily nitrided. Such unsatisfactory nitriding is due to a large heat capacity of trimethylamine and hence difficulty in heating trimethylamine. Trimethylamine has a constant-pressure heat capacity (constant-pressure molar heat capacity) at 550° C. of 190 J/mol·K, which is about four times the constant-pressure heat capacity of 50 J/mol·K of ammonia. Under the above nitriding condition, deposition rate was as low as 0.27 nm/min, which proved that the silicon nitride film forming process using trimethylamine is not suitable for mass production.

A semiconductor device fabricating apparatus forms a silicon dioxide film on an object to be processed, such as a semiconductor wafer, by means of a chemical vapor deposition process (CVD process) or the like.

When forming a silicon dioxide film on a semiconductor wafer, such as a silicon wafer, by the CVD process, the semiconductor wafer is placed in a thermal processing device. Subsequently, an interior of the thermal processing device is evacuated to a predetermined pressure in a range of, for example, 13.3 Pa (0.1 Torr) to 1330 Pa (10 Torr), and is heated to a predetermined temperature in a range of, for example, 700 to 900° C. Then, process gases, such as dichlorosilane gas ($SiH_2Cl_2$ gas) and dinitrogen oxide gas ($N_2O$ gas), are supplied into the thermal processing device for a predetermined time. Thus, the dichlorosilane is oxidized, and a silicon dioxide film is deposited on a surface of the semiconductor wafer.

The silicon dioxide film thus formed is dense, excellent in insulating performance and resistant to peeling.

However, when forming the silicon dioxide film on the semiconductor wafer by the aforesaid chemical vapor deposition process, the silicon dioxide film is deposited on the semiconductor wafer at a low deposition rate.

SUMMARY OF THE INVENTION

It is a first object of the present invention to provide an oxynitride film forming method and an oxynitride film forming system capable of forming a thin oxynitride film having a desired nitrogen content.

According to one feature of the present invention, an oxynitride film forming method comprises: a reaction chamber heating step of heating a reaction chamber to a predetermined temperature, the reaction chamber containing an object to be processed; a gas heating step of heating a process gas to a temperature not lower than a reaction temperature at which an oxynitride film can be formed, the process gas consisting of dinitrogen oxide gas; and a film forming step of forming an oxynitride film on the object to be processed by supplying the heated process gas into the heated processing chamber; wherein the temperature to which the reaction chamber is heated in the reaction chamber heating step is set at a temperature below a temperature at which the process gas undergoes a reaction.

According to the feature, the temperature of the reaction chamber is set below the reaction temperature of the process gas. Consequently, the oxidation rate by the process gas supplied into the reaction chamber is reduced and hence a thin oxynitride film can be formed. On the other hand, the process gas is heated in advance to a temperature not lower than the reaction temperature at which an oxynitride film can be formed, and is then supplied into the reaction chamber in a state suitable for oxynitriding. Consequently, an oxynitride film having a desired nitrogen content can be formed on the object to be processed.

Preferably, the process gas is heated to a temperature at which the process gas is pyrolyzed substantially completely, in the gas heating step. In the case, the process gas can have a high nitrogen concentration, and hence an oxynitride film having a desired nitrogen content can be surely formed on the object to be processed.

Preferably, the reaction chamber is heated to a temperature in a range of 750 to 850° C. in the reaction chamber heating step, and the process gas is heated to 900° C. or above in the gas heating step. When the process gas is heated at 900° C. or above, the process gas is pyrolyzed substantially completely. In addition, a thin oxynitride film can be formed when the temperature of the reaction chamber is set in the range of 750 to 850° C.

According to another feature of the present invention, an oxynitride film forming system comprises: a reaction vessel defining a reaction chamber that can contain an object to be processed; a reaction chamber heating unit that can heat the reaction chamber to a predetermined temperature; a process gas supplying unit that can supply a process gas into the reaction chamber, the process gas consisting of dinitrogen oxide gas; a gas heating unit, provided at the gas supplying unit, that can heat the process gas to a predetermined temperature before the process gas is supplied into the reaction chamber; and a controller that can control the gas heating unit so as to heat the process gas to a temperature not lower than a reaction temperature at which an oxynitride film can be formed and control the reaction chamber heating unit so as to heat the reaction chamber to a temperature below a reaction temperature at which the process gas undergoes a reaction.

According to the feature, by means of the controller, the temperature of the reaction chamber is controlled below the reaction temperature of the process gas. Consequently, the oxidation rate by the process gas supplied into the reaction chamber is reduced and hence a thin oxynitride film can be formed. On the other hand, by means of the controller, the process gas is heated in advance to a temperature not lower than the reaction temperature at which an oxynitride film can be formed, and is then supplied into the reaction chamber in a state suitable for oxynitriding. Consequently, an oxynitride film having a desired nitrogen content can be formed on the object to be processed.

Preferably, the controller is adapted to control the gas heating unit to heat the process gas to a temperature at which the process gas is pyrolyzed substantially completely. In the case, the process gas can have a high nitrogen concentration, and hence an oxynitride film having a desired nitrogen content can be surely formed on the object to be processed.

Preferably, the controller is adapted to control the gas heating unit to heat the process gas to 900° C. or above, and to control the reaction chamber heating unit to heat the reaction chamber to a temperature in a range of 750 to 850° C. When the process gas is heated at 900° C. or above, the process gas is pyrolyzed substantially completely. In addition, a thin oxynitride film can be formed when the temperature of the reaction chamber is set in the range of 750 to 850° C.

In addition, preferably, the reaction vessel defining the reaction chamber includes an inner tube that contains the object to be processed and an outer tube that surrounds the inner tube, and the gas supplying unit is adapted to supply the process gas into the inner tube.

Another second object of the present invention is to provide techniques that enable to form an oxide film of a highly uniform thickness on an object to be processed by subjecting the object to a dry oxidation process while using a low process temperature.

According to one feature of the present invention, a silicon dioxide film forming method comprises: a reaction chamber heating step of heating a reaction chamber to a predetermined temperature, the reaction chamber containing an object to be processed having a surface provided with at least a silicon layer; a gas pretreating step of energizing a process gas to produce water, the process gas containing a compound gas including hydrogen and chlorine, and oxygen gas; and a film forming step of forming a silicon dioxide film by supplying the process gas that has been energized to produce water into the heated reaction chamber to oxidize the silicon layer of the object to be processed.

Preferably, the water is produced in the gas pretreating step to an extent such that the process gas does not produce water any further at the temperature to which the reaction chamber is heated.

Preferably, the process gas is energized to produce water by heating the process gas, in the gas pretreating step.

Preferably, the process gas is heated to a temperature that is higher than the temperature at which the reaction chamber is heated in the reaction chamber heating step.

For example, the compound gas including hydrogen and chlorine is a hydrogen chloride gas.

According to another feature of the present invention, a silicon dioxide film forming system comprises: a reaction vessel defining a reaction chamber that can contain an object to be processed having a surface provided with at least a silicon layer; a reaction chamber heating unit that can heat the reaction chamber to a predetermined temperature; a process gas supplying unit that can supply a process gas into the reaction chamber, the process gas containing a compound gas including hydrogen and chlorine, and oxygen gas; and a gas heating unit, provided at the gas supplying unit, that can heat the process gas to produce water before the process gas is supplied into the reaction chamber.

Preferably, the reaction chamber can contain a plurality of objects to be processed in a tier-like manner, and the reaction chamber heating unit has a heater surrounding the reaction chamber.

Preferably, the gas heating unit comprises a heating vessel defining a heating chamber packed with flow impeding members and a heating element surrounding the heating chamber, and the heating element includes a resistance heating member and a ceramic cover sealing the resistance heating member therein.

For example, the resistance heating member is made of carbon with a high purity. In addition, for example, the ceramic cover is made of quartz.

Another object of the present invention is to provide a silicon nitride film forming method and a silicon nitride film forming system capable of forming a silicon nitride film of a substantially stoichiometric composition at a low process temperature at a high film forming rate.

According to one feature of the present invention, a silicon nitride film forming method comprises: a reaction chamber heating step of heating a reaction chamber to a predetermined temperature, the reaction chamber containing an object to be processed having a surface provided with at least a silicon layer; a reaction chamber pressure regulating step of regulating pressure in the reaction chamber to a predetermined pressure; a gas heating step of preheating trimethylamine to a temperature such that the preheated trimethylamine can produce nitrogen when heated in the reaction chamber; and a film forming step of forming a silicon nitride film by supplying a process gas including the preheated trimethylamine and a silane gas into the reaction chamber to nitride the silicon layer of the object to be processed.

According to the feature, the trimethylamine is used as a source of nitrogen, which enables the nitriding process to be conducted at a low process temperature. Since the trimethylamine is supplied into the reaction chamber after being heated to a temperature not lower than a temperature at which the trimethylamine becomes able to supply nitrogen when heated in the reaction chamber, the trimethylamine undergoes pyrolysis when heated in the reaction chamber and a large amount of nitrogen can be supplied to the object to be processed. Consequently, a silicon nitride film of a substantially stoichiometric composition can be formed at a high film forming rate.

Preferably, the reaction chamber is heated to a temperature in a range of 400 to 650° C. by the reaction chamber heating step, and the trimethylamine is heated to a temperature in a range of 500 to 700° C. by the gas heating step. When the trimethylamine that has been heated at the temperature in the range of 500 to 700° C. is supplied into the reaction chamber that has been heated at the temperature in the range of 400 to 650° C., the trimethylamine is pyrolyzed substantially completely in the reaction chamber.

Preferably, in the gas heating step, the trimethylamine is heated under a pressure in a range of 20 to 90 kPa. In the case, the trimethylamine can be heated efficiently because the pressure in the range of 20 to 90 kPa is higher than that in the reaction chamber.

According to another feature of the present invention, a silicon nitride film forming system comprises: a reaction vessel defining a reaction chamber that can contain an object to be processed having a surface provided with at least a silicon layer; a reaction chamber heating unit that can heat the reaction chamber to a predetermined temperature; a reaction chamber pressure regulating unit that can regulate pressure in the reaction chamber to a predetermined pressure; a first gas supplying unit that supplies a silane gas into the reaction chamber; a second gas supplying unit that supplies trimethylamine gas into the reaction chamber; a gas heating unit, provided at the second gas supplying unit, that can preheat the trimethylamine gas to a predetermined temperature; and a controller that can control the gas heating unit so as to preheat the trimethylamine gas to a preheating temperature such that the trimethylamine gas preheated to the preheating temperature can produce nitrogen when heated in the reaction chamber.

According to the feature, the trimethylamine is used as a source of nitrogen, which enables the nitriding process to be conducted at a low process temperature. Since the trimethylamine is supplied into the reaction chamber after being heated to a temperature not lower than a temperature at which the trimethylamine becomes able to supply nitrogen when heated in the reaction chamber, the trimethylamine undergoes pyrolysis when heated in the reaction chamber and a large amount of nitrogen can be supplied to the object to be processed. Consequently, a silicon nitride film of a substantially stoichiometric composition can be formed at a high film forming rate.

Preferably, the reaction vessel defining the reaction chamber includes an inner tube that contains the object to be processed and an outer tube that surrounds the inner tube, the first gas supplying unit is adapted to supply the silane gas into the inner tube, and the second gas supplying unit is adapted to supply the trimethylamine gas into the inner tube.

In addition, preferably, the second gas supplying unit has a gas supply pipe connected to the reaction chamber, and the gas supply pipe is provided with a restricting part formed by reducing an inside diameter of the gas supply pipe on a downstream side of the gas heating unit. In the case, the trimethylamine stays in a part of the gas supply pipe extending through the gas heating unit for a sufficiently long time and, consequently, the gas heating unit is able to heat the trimethylamine at an improved heating efficiency.

In addition, preferably, the controller is adapted to control the gas heating unit to heat the trimethylamine to a temperature in a range of 500 to 700° C., and to control the reaction chamber heating unit to heat the reaction chamber to a temperature in a range of 400 to 650° C. When the trimethylamine that has been heated at the temperature in the range of 500 to 700° C. is supplied into the reaction chamber that has been heated at the temperature in the range of 400 to 650° C., the trimethylamine is pyrolyzed substantially completely in the reaction chamber.

Preferably, the gas heating unit is adapted to heat the trimethyl-amine under a pressure in a range of 20 to 90 kPa. In the case, the trimethylamine can be heated efficiently because the pressure in the range of 20 to 90 kPa is higher than that in the reaction chamber.

Another object of the present invention is to provide a silicon dioxide film forming method and a silicon dioxide film forming system capable of forming a silicon dioxide film on an object to be processed, at a high film forming rate.

According to one feature of the present invention, a silicon dioxide film forming method comprises: a reaction chamber heating step of heating a reaction chamber to a predetermined temperature, the reaction chamber containing an object to be processed having a surface provided with at least a silicon layer; a reaction chamber pressure regulating step of regulating pressure in the reaction chamber to a predetermined pressure; a gas heating step of preheating dinitrogen oxide gas to a temperature not lower than 700° C.; and a film forming step of forming a silicon dioxide film by supplying a process gas including the preheated dinitrogen oxide gas and a silane gas into the reaction chamber to oxidize the silicon layer of the object to be processed.

According to the feature, the dinitrogen oxide is heated to a temperature not lower than 700° C. before being supplied into the reaction chamber. Thus, pyrolysis of the dinitrogen oxide is promoted, a large amount of oxygen is produced, and hence oxidation of the silane gas in the reaction chamber is promoted. Consequently, a silicon dioxide film can be formed on the object to be processed at a high film forming rate.

Preferably, in the gas heating step, the dinitrogen oxide is heated to a temperature in a range of 750 to 950° C. When the dinitrogen oxide is supplied into the reaction chamber after heated to the temperature at 750 to 950° C., pyrolysis of the dinitrogen oxide can be promoted, and a silicon dioxide film can be formed at a further increased film forming rate.

According to another feature of the present invention, a silicon dioxide film forming system comprises: a reaction vessel defining a reaction chamber that can contain an object to be processed having a surface provided with at least a silicon layer; a reaction chamber heating unit that can heat the reaction chamber to a predetermined temperature; a reaction chamber pressure regulating unit that can regulate pressure in the reaction chamber to a predetermined pressure; a first gas supplying unit that supplies a silane gas into the reaction chamber; a second gas supplying unit that supplies dinitrogen oxide gas into the reaction chamber; a gas heating unit, provided at the second gas supplying unit, that can preheat the dinitrogen oxide gas to a predetermined temperature; and a controller that can control the gas heating unit so as to preheat the dinitrogen oxide gas to a temperature not lower than 700° C.

According to the feature, the dinitrogen oxide is heated by the gas heating unit to a temperature not lower than 700° C. before being supplied into the reaction chamber. Thus, pyrolysis of the dinitrogen oxide is promoted, a large amount of oxygen is produced, and hence oxidation of the silane gas in the reaction chamber is promoted. Consequently, a silicon dioxide film can be formed on the object to be processed at a high film forming rate.

Preferably, the reaction vessel defining the reaction chamber includes an inner tube that contains the object to be processed and an outer tube that surrounds the inner tube, the first gas supplying unit is adapted to supply the silane gas into the inner tube, and the second gas supplying unit is adapted to supply the dinitrogen oxide gas into the inner tube.

In addition, preferably, the second gas supplying unit has a gas supply pipe connected to the reaction chamber, and the gas supply pipe is provided with a restricting part formed by reducing an inside diameter of the gas supply pipe on a downstream side of the gas heating unit. In the case, the dinitrogen oxide stays in a part of the gas supply pipe extending through the gas heating unit for a sufficiently long time and, consequently, the gas heating unit is able to heat the dinitrogen oxide at an improved heating efficiency.

In addition, preferably, the controller is adapted to control the gas heating unit to heat the dinitrogen oxide gas to a temperature in a range of 750 to 950° C.

BRIEF DESCRIPTION OF THE DRAWINGS

FIG. 1 is a schematic view of a thermal processing system in a first embodiment according to the present invention;

FIG. 2 is a table of concentrations of component gases of respective heated process gases;

FIG. 3 is a table of thicknesses and maximum nitrogen contents (peak N) of respective silicon oxynitride films;

FIG. 4 is a table of temperatures of an inner tube when a heated process gas is supplied into the inner tube;

FIG. 5 is a table of increments in the thickness and maximum nitrogen contents of respective silicon oxynitride films;

FIG. 9 is a graph showing results of film thickness measurements performed to examine the dependence of film thickness uniformity on wafer boat portions;

FIG. 10 is a graph showing results of experiments conducted to examine the relation between oxidation time and film thickness uniformity;

FIG. 11 is a table of measured hydrogen concentrations of an atmosphere in the reaction tube at a region near an exhaust port, in conditions where a process gas is heated by a gas heating unit and in conditions where the process gas is not heated;

FIG. 12 is a schematic view of a thermal processing system in a third embodiment according to the present invention;

FIG. 15 is a schematic view of a thermal processing system in a fourth embodiment according to the present invention;

FIG. 16 is a typical view of a part of the film forming system of FIG. 15 in the vicinity of a gas heating unit;

FIG. 17 is a table showing the relation between temperatures of the gas heating unit and oxygen amounts;

FIG. 18 is a table showing the relation between temperatures of the gas heating unit and film deposition rates.

BEST MODE FOR CARRYING OUT THE INVENTION

Figure 6:
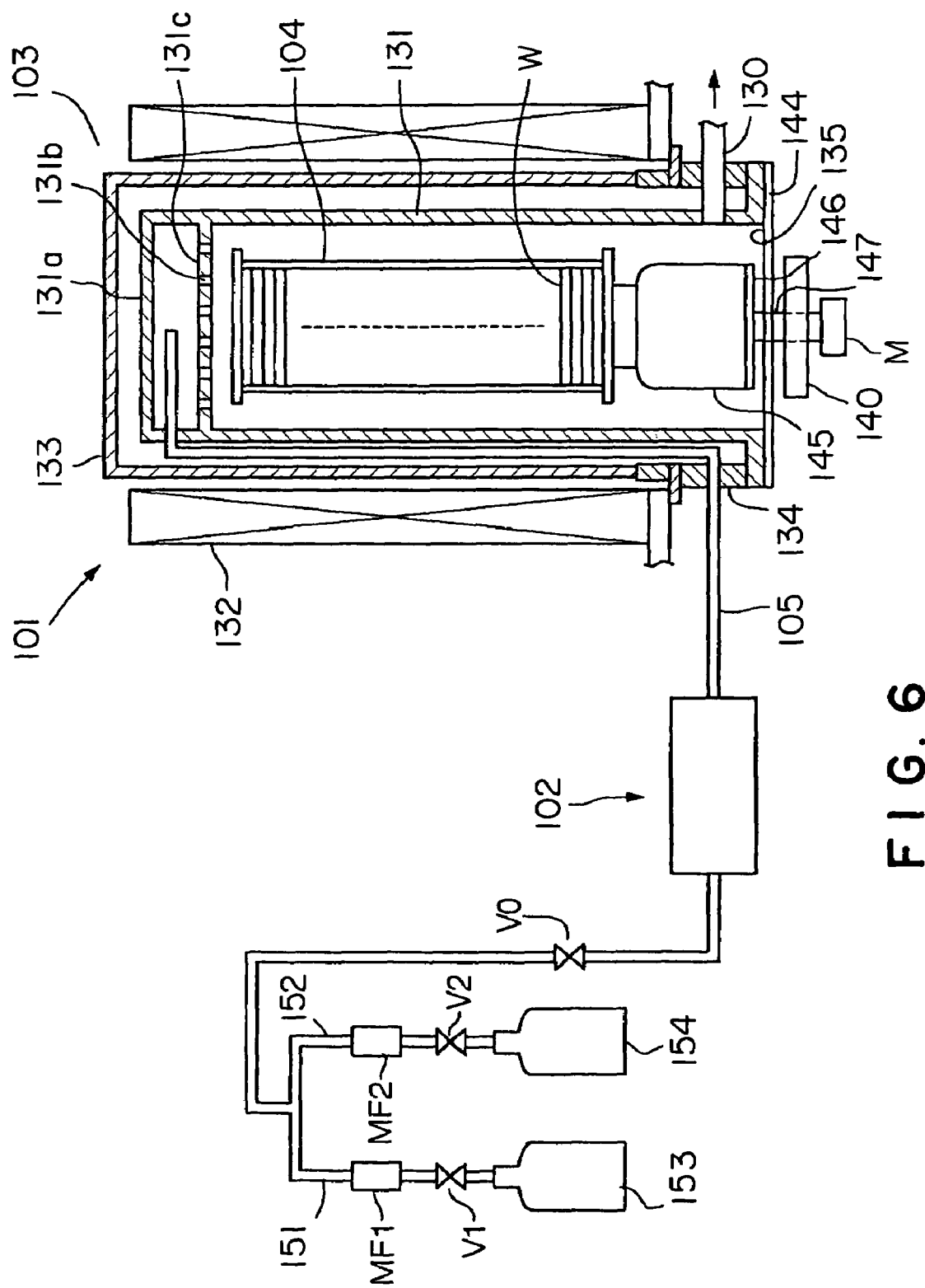
FIG. 6 is a longitudinal sectional view of a silicon dioxide film forming system in a second embodiment according to the present invention for carrying out a silicon dioxide film forming method according to the present invention.

A batch-type vertical thermal processing system in a first embodiment according to the present invention will be described as applied to forming an oxynitride film by an oxynitride film forming method according to the present invention.

Referring to FIG. 1, a thermal processing system 1 has a substantially cylindrical reaction tube 2 set in a vertical posture. The reaction tube 2 is a double-wall structure having an inner tube 3 and an outer tube 4 having a closed upper end. The outer tube 4 surrounds the inner tube 3 so as to form an annular space of a predetermined thickness between the inner tube 3 and the outer tube 4. The inner tube 3 and the outer tube 4 are formed of a heat-resisting material, such as quartz (crystal).

A cylindrical manifold 5 made of a stainless steel (SUS) is disposed under the outer tube 4. A lower end of the outer tube 4 is joined hermetically to the manifold 5. The inner tube 3 is supported on a support ring 6, which is formed integrally with the manifold 5 and projecting from the inner circumference of the manifold 5.

A lid 7 is disposed below the manifold 5. A boat elevator 8 is adapted to move the lid 7 vertically. When the lid 7 is raised by the boat elevator 8, an open lower end of the manifold 5 is closed.

A wafer boat 9 made of, for example, quartz is mounted on the lid 7. The wafer boat 9 can hold a plurality of objects to be processed, such as semiconductor wafers 10, at predetermined vertical intervals.

A heat insulating member 11 surrounds the reaction tube 2. A reaction tube heater 12, such as a resistance-heating element, is provided on an inner circumference of the heat insulating member 11.

A gas supply pipe 13 is connected to a side wall of the manifold 5. The gas supply pipe 13 is connected to a part of the side wall of the manifold below the support ring 6 so as to open into a space defined by the inner tube 3. Thus, a process gas is adapted to be supplied through the gas supply pipe 13 into the inner tube 3 of the reaction tube 2.

A discharge port 14 is formed in a part of the side wall of the manifold 5 on a level above that of the support ring 6. The discharge port 14 opens into the annular space between the inner tube 3 and the outer tube 4 of the reaction tube 2. A process gas is supplied through the gas supply pipe 13 into the inner tube 3 and a film forming process is started. Reaction products produced by the film forming process flow through the annular space between the inner tube 3 and the outer tube 4 and are discharged from the thermal processing system 1 through the discharge port 14.

A gas heating unit 15 provided with, for example, a resistance heating element is combined with the gas supply pipe 13. The heating unit 15 is adapted to heat the process gas being dinitrogen oxide ($N_2O$) gas that flows through the heating unit 15, to a predetermined temperature. The heated process gas flows through the gas supply pipe 13 into the reaction tube 2.

A controller 16 is connected to the boat elevator 8, the reaction tube heater 12, the gas supply pipe 13 and the heating unit 15. The controller 16 comprises a microprocessor, a process controller or the like. The controller 16 is adapted to measure temperatures and pressures of predetermined parts of the thermal processing system 1, and provide control signals or the like to the aforesaid components on the basis of measured data, in order to control them.

An oxynitride film forming method that uses the thermal processing system 1 will be described as applied to forming silicon oxynitride films on semiconductor wafers 10. With respect to the following description, the controller 16 controls operations of the aforesaid components of the thermal processing system 1.

The boat elevator 8 lowers the lid 7, and the wafer boat 9 holding the semiconductor wafers 10 is placed on the lid 7. Then, the boat elevator 8 raises the lid 7 to load the wafer boat 9 holding the semiconductor wafers 10 into the reaction tube 2. Thus, the semiconductor wafers 10 are held (contained) inside the inner tube 3 of the reaction tube 2 and the reaction tube 2 is sealed.

The heating unit 15 is heated to a predetermined temperature by a heater, not shown. The process gas was supplied through the heating unit 15 while the heating unit 15 was heated at 750° C., 900° C. or 1000° C., so that the concentrations of the components of the process gas heated by the heating unit 15 were measured to examine the effect of the temperature of the heating unit 15. The measured concentrations (mole percentages) of the components of the process gas in the respective conditions are shown in FIG. 2.

As obvious from FIG. 2, about half the dinitrogen oxide was not pyrolyzed at 750° C. At 900° C., 8% of the dinitrogen oxide was not pyrolyzed. At 1000° C., 1% of the dinitrogen oxide was not pyrolyzed. Thus, it was confirmed that dinitrogen oxide can be substantially completely pyrolyzed when the heating unit 15 is heated at a temperature not lower than 900° C. It was also found that nitrogen, oxygen, nitrogen monoxide and nitrogen dioxide or the like are produced by the pyrolysis of dinitrogen oxide.

The nitrogen concentration increased from 28% to 40% when the temperature was raised from 750° C. to 900° C. The nitrogen concentration greatly increased to 47% when the temperature was raised to 1000° C. That is, it was found that a large amount of nitrogen can be supplied to the semiconductor wafers 10 when the temperature is not lower than 900° C. On the other hand, oxygen concentration, as compared with nitrogen concentration, did not increase significantly when the temperature was raised from 750° C. through 900° C. to 1000° C., because the ratio of decrease of oxygen is greater than that of nitrogen since nitrogen monoxide and nitrogen dioxide are produced from nitrogen and oxygen. Thus, it was confirmed that the nitrogen concentration of the process gas increases and the increase of the oxygen concentration is not as great as that of nitrogen concentration when dinitrogen oxide is heated to temperatures not lower than 900° C. That is, because the increase of the nitrogen concentration of the process gas is large relative to that of the oxygen concentration of the same when the process gas is heated to temperatures not lower than 900° C., a large amount of nitrogen can be supplied to the semiconductor wafers 10.

Preferably, the heating unit 15 is heated to a temperature of 900° C. or above, at which dinitrogen oxide, i.e., the process gas, is substantially completely pyrolyzed. Since only 1% of the dinitrogen oxide is not pyrolyzed when the dinitrogen oxide is heated at 1000° C., further pyrolysis of the dinitrogen oxide cannot be expected even if the dinitrogen oxide is heated to a higher temperature of, for example, 1100° C. Thus, it is most preferable to heat the heating unit 15 to about 1000° C. In this embodiment, the heating unit 15 is heated at 1000° C.

The reaction tube heater 12 heats the interior of the reaction tube 2 to a predetermined temperature, such as 800° C., lower than the temperature to which the process gas is heated. The temperature of the reaction tube 2 is determined according to thickness of a silicon oxynitride film to be formed, and is a temperature lower than the temperature to which the process gas is heated and high enough to form a silicon oxynitride film. Preferably, the temperature of the reaction tube 2 is, for example, in a range of 750 to 850° C. The thickness of the silicon oxynitride film is dependent on the temperature of the reaction tube 2 and the duration of supply of the process gas. A silicon oxynitride film having a predetermined nitrogen content and a desired thickness cannot be formed if the temperature of the reaction tube 2 is below 750° C. On the other hand, an oxide film grows greatly and the nitrogen content of the silicon oxynitride film decreases if the temperature of the reaction tube 2 is above 850° C. In addition, if the reaction tube 2 is heated to a temperature not higher than 750° C. and the process gas is supplied for a long time, in some cases, the amount of nitrogen diffused in the film may be saturated. Therefore, it is more preferable that the temperature of the reaction tube 2 is in a range of 800 to 850° C.

After the reaction tube 2 has been sealed, the reaction tube 2 is evacuated to a predetermined pressure of, for example, 95760 Pa (720 Torr). Then, dinitrogen oxide gas is supplied, for example, at 5 l/min (5 slm) into the gas supply pipe 13, maintaining the pressure in the reaction tube 2 at 95760 Pa (720 Torr).

The heating unit 15 pyrolyzes the dinitrogen oxide gas (process gas) introduced into the gas supply pipe 13. The pyrolyzed process gas is supplied through the gas supply pipe 13 onto the semiconductor wafers 10 placed inside the inner tube 3.

In the reaction tube 2, surfaces of the semiconductor wafers 10 are oxynitrided by the pyrolyzed process gas. The process gas is supplied for a predetermined time of, for example, 15 min, silicon oxynitride films are formed on the semiconductor wafers 10, respectively. FIG. 3 shows thicknesses and maximum nitrogen contents (Peak N) of silicon oxynitride films formed on semiconductor wafers. The maximum nitrogen content (Peak N) is the greatest one of respective nitrogen contents of different parts of a silicon oxynitride film, and is a value that serves as a criterion on which the estimation of the nitrogen content of the silicon oxynitride film is based. Comparative silicon oxynitride films of qualities as shown in FIG. 3 were formed by silicon oxynitride film forming methods of Comparative examples 1 and 2, wherein the process gas was not heated by the heating unit 15 and the reaction tube 2 was heated at 800° C. and 900° C., respectively.

As shown in FIG. 3, the silicon oxynitride film formed by the silicon oxynitride film forming method of the present invention (Example) had a maximum nitrogen content of 2.24 atomic percent even if the temperature of the reaction tube 2 was 800° C., which is lower than conventional temperature. That is, the maximum nitrogen content of 2.24 atomic percent of the silicon oxynitride film formed by the silicon oxynitride film forming method in the Example was comparable to the maximum nitrogen content of 2.33 atomic percent of the silicon oxynitride film formed by the silicon oxynitride film forming method in the Comparative example 1 wherein the reaction tube 2 is heated to 900° C., which may be due to the increase of the nitrogen concentration of the process gas resulting from the pyrolysis of dinitrogen oxide by the heating unit 15.

The reduction of the temperature of the reaction tube 2 to 800° C. caused the reduction of oxidation rate and, consequently, the silicon oxynitride film as thin as 2 nm could be formed. That is, the silicon oxynitride film forming method of the present invention was able to form a thin silicon oxynitride film without reducing maximum nitrogen content, whereas the silicon oxynitride film formed by the silicon oxynitride film forming method in the Comparative example 2, wherein the reaction tube 2 is heated to 800° C., was thin but had a low maximum nitrogen content. In addition, since the heating unit 15 pyrolyzed the dinitrogen oxide substantially completely, the silicon oxynitride film had an excellent intrasurface thickness uniformity.

The supply of the process gas through the gas supply pipe 13 is stopped after desired silicon oxynitride films have been formed on the surfaces of the semiconductor wafers 10. The gas prevailing in the reaction tube 2 is discharged through the discharge port 14 and the pressure in the reaction tube 2 returns to the atmospheric pressure. Then, the boat elevator 8 lowers the lid 7 to unload the wafer boat 9 holding the semiconductor wafers 10 from the reaction tube 2.

The temperature of the inner tube 3 was measured to examine the effect of supplying the process gas heated at the temperature (1000° C.) higher than the temperature (800° C.) of the reaction tube 2 into the reaction tube 2 on the temperature of the inner tube 3. Temperature was measured at four measuring points T1 to T4 on the inner circumference of the inner tube 3, as shown in FIG. 1. Measured temperatures are shown in FIG. 4. Measured temperatures of the inner tube 3 in Comparative example 3 wherein the process gas is not heated are also shown in FIG. 4 for comparison. As obvious from FIG. 4, whereas the temperature of the process gas used in the silicon oxynitride film forming method of the present invention and that of the same used in the silicon oxynitride film forming method in Comparative example 3 were different, the temperatures of parts of the inner circumference of the inner tube 3 during the execution of the silicon oxynitride film forming method of the present invention were substantially equal to those of the same parts of the inner tube 3 during the execution of the silicon oxynitride film forming method in Comparative example 3. Thus, it was confirmed that the supply of the heated process gas into the reaction tube 2 does not disturb the uniformity of temperature distribution in the reaction tube 2.

As apparent from the foregoing description, according to the present embodiment, the process gas is heated to 1000° C. by the heating unit 15, and the substantially completely pyrolyzed process gas is supplied into the reaction tube 2. Consequently, the nitrogen concentration of the process gas can be increased and a large amount of nitrogen can be supplied onto the semiconductor wafers 10. Therefore, even if the temperature of the reaction tube 2 is reduced from 900° C. to 800° C., a silicon oxynitride film having a maximum nitrogen content substantially equal to that of a silicon oxynitride film formed by the silicon oxynitride film forming method that heats the reaction tube at 900° C. can be formed. In addition, since the temperature of the reaction tube 2 is reduced from 900° C. to 800° C., a very thin silicon oxynitride film can be formed.

Modifications of the silicon oxynitride film forming method in the first embodiment are possible.

The foregoing silicon oxynitride forming method in the first embodiment subjects the semiconductor wafers 10 directly to the oxynitriding process to form the silicon oxynitride film on the semiconductor wafers 10. However, semiconductor wafers having surfaces coated respectively with silicon dioxide films may be subjected to the oxynitriding process to form silicon oxynitride films on the semiconductor wafers.

Semiconductor wafers 10 having surfaces coated respectively with, for example, 3 nm thick silicon dioxide films were held on the wafer boat 9. The pressure in the reaction tube 2 was set at 95760 Pa (720 Torr), the heating unit 15 was heated to 900° C. or 1000° C. The reaction tube 2 was heated to 750° C., 800° C. or 850° C. Dinitrogen oxide gas was supplied through the gas supply pipe 13 at 5 l/min (5 slm) for 15 min to form silicon oxynitride films on the semiconductor wafers 10, respectively, by subjecting the silicon dioxide films to an oxynitriding process. FIG. 5 shows thickness increment and maximum nitrogen content of the thus formed silicon oxynitride films. FIG. 5 also shows those of cases wherein the temperature of the heating unit 15 is 1000° C. and the process gas is supplied for 30 min, and cases wherein the heating unit 15 is not heated.

As obvious from FIG. 5, heating the process gas by the heating unit 15 can increase maximum nitrogen content. The thicknesses are substantially the same when the processes are the same in the temperature of the reaction tube 2 and reaction time. Thus, a very thin silicon oxynitride film having a desired nitrogen content can be formed by heating the process gas by the heating unit 15 and by heating the reaction tube 2 to a reduced temperature.

For example, a very thin silicon oxynitride film having a maximum nitrogen content equal to that of a silicon oxynitride film (thickness increment: 1.01 nm, maximum nitrogen content (Peak N): 0.52 atomic percent) formed by heating the reaction tube 2 to 850° C. and without heating the process gas by the heating unit 15 can be formed by heating the process gas to 900° C. by the heating unit 15 and by heating the reaction tube 2 to 750° C. The silicon oxynitride film thus formed can have a thickness increment of 0.29 nm, which is about ¼ of the thickness increment of 1.01 nm.

When the respective temperatures of the heating unit 15 and the reaction tube 2 were 1000° C. and 750° C. and the reaction time was increased from 15 min to 30 min, the maximum nitrogen content (Peak N) decreased from 1.13 atomic percent to 0.78 atomic percent. It may be considered that, in some cases, the amount of nitrogen diffused in the film is saturated and, consequently, the thickness increases, when the temperature of the reaction tube 2 is comparatively low and the reaction time is long. Thus, it is preferable to heat the reaction tube 2 to a temperature not lower than 800° C. when the reaction time is as long as 30 min.

The oxynitride film forming system in the first embodiment is a batch-type vertical thermal processing system provided with the reaction tube 2 of a double-wall structure consisting of the inner tube 3 and the outer tube 4. The present invention is not limited thereto, and is applicable to various processing systems for forming an oxynitride film on an object to be processed. The object to be processed is not limited to a semiconductor wafer and the present invention is applicable to processing various objects, such as glass substrates for forming LCDs.

Figure 7:
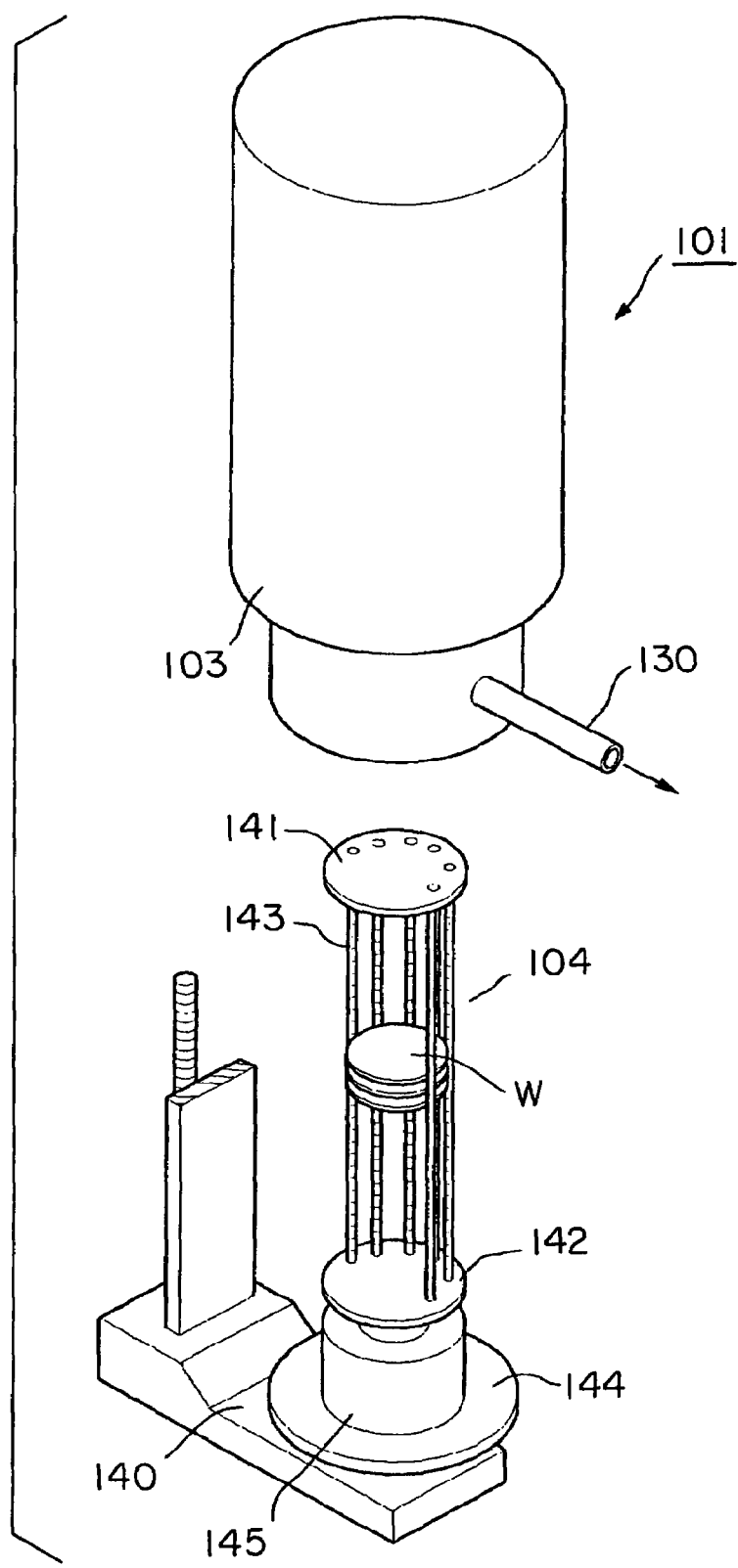
FIG. 7 is a schematic perspective view of an essential part of the silicon dioxide film forming system of FIG. 6.

FIG. 6 shows a silicon dioxide film forming system in a second embodiment according to the present invention for carrying out a silicon dioxide film forming method according to the present invention. The silicon dioxide film forming system includes a vertical thermal processing unit 101 and a heating unit 102 that can heat a process gas to be supplied to the vertical thermal processing unit 101. As shown in FIGS. 6 and 7, the vertical thermal processing unit 101 comprises a vertical thermal processing furnace 103, a wafer boat 104 as a wafer holder, a boat elevator 140 for vertically moving the wafer boat 104, and a gas supply pipe 105 and an exhaust pipe 130 connected to the thermal processing furnace 103.

The vertical thermal processing furnace 103 includes a reaction tube 131, i.e., a reaction vessel, made of, for example, quarts, a reaction tube heater 132 provided with a resistance heating element and surrounding the reaction tube 131, and a liner soaking tube 133 interposed between the reaction tube 131 and the reaction tube heater 132 and supported on a heat insulating member 134. The reaction tube 131 has an open lower end and a top wall 131a. A gas diffusing plate 131c provided with a plurality of holes 131b is disposed in the reaction tube 131 at a position at a short distance below the top wall 131a. The gas supply pipe 105 extends through the heat insulating member 134, bends at right angle at a position on the inner side of the heat insulating member 134, extends upright through a space between the reaction tube 131 and the liner tube 133 and extends into a space between the top wall 131a of the reaction tube 131 and the gas diffusing plate 131c.

As shown in FIG. 7, the wafer boat 104 has a top plate 141, a bottom plate 142 and a plurality of support bars 143 extended between the top plate 141 and the bottom plate 142. Each of the support bars 143 is provided with horizontal grooves to hold wafers W therein. The wafer boat 104 is mounted on a heat insulating cylinder 145 placed on a lid 144 for closing the open lower end 135 (FIG. 6) of the reaction tube 131. The heat insulating cylinder 145 is supported on a turntable 146 (FIG. 6) connected to a shaft 147. The shaft 147 is adapted to be driven for rotation by a driving unit M disposed on the boat elevator 140 (FIG. 6), to rotate the turntable 146 supporting the wafer boat 104. The lid 144 is moved vertically by the boat elevator 140 to carry the wafer boat 104 into and out of the thermal processing furnace 103.

Figure 8:
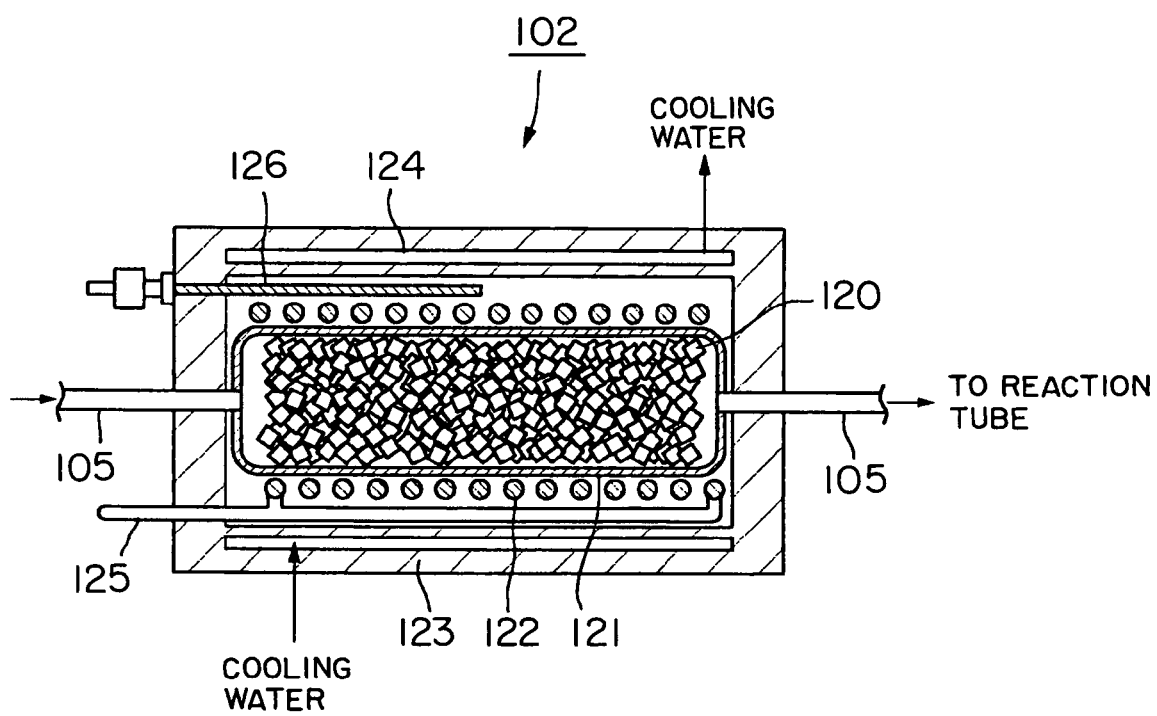
FIG. 8 is a sectional view of a gas heating unit included in the silicon dioxide film forming system of FIG. 6.

Referring to FIG. 6, the heating unit 102 is placed in a part of the gas supply pipe 105 extending outside the vertical thermal processing unit 101. As shown in FIG. 8, the heating unit 102 comprises a heating pipe 121 made of, for example, transparent quartz defining a heating chamber, a heating element 122 helically wound around the heating pipe 121, and a cylindrical heat insulating member 123 covering the heating pipe 121 and the heating element 122. A cooling water passage 124 is formed in the heat insulating member 123. A cooling medium, such as cooling water, is passed through the cooling water passage 124. For example, many transparent quartz beads 120 as flow impeding members are packed in the heating pipe 121 to extend the staying time of a gas in the heating pipe 121. The quartz beads 120 exert resistance against the flow of the gas in the heating pipe 121. The quartz beads 120 are heated and the gas flows touching the heated quartz beads 120, whereby the gas is heated efficiently.

The heating element 122 is a carbon braid formed by braiding a plurality of carbon fiber strands of a high purity scarcely containing metallic impurities. Electric power is supplied through a cable 125 to the heating element 122 to generate heat. Preferably, the heating unit 102 is provided with a temperature sensor 126, such as a thermocouple.

As shown in FIG. 6, a valve V0 is placed in a part of the gas supply pipe 105 on an upstream side of the heating unit 102, and branch pipes 151 and 152 are connected to the valve V0. The branch pipes 151 and 152 are connected to an oxygen gas source 153 and a hydrogen chloride gas source 154, respectively. Shown also in FIG. 6 are valves V1 and V2, and mass flow controllers MF1 and MF2, i.e., flow controllers for controlling the flow rate of the gas. Preferably, the heating unit 102 is disposed as close to the thermal processing furnace 103 as possible to prevent the heated gas from cooling before flowing into the thermal processing furnace 103.

The operation of the silicon dioxide film forming system in the second embodiment will be described.

A plurality of wafers W, such as sixty wafers W, each having a surface provided with a silicon layer, are held on the wafer boat 104 in a tier-like manner. Then, the boat elevator 140 carries the wafer boat 104 into the reaction tube 131 that has been heated beforehand at a predetermined temperature by the reaction tube heater 132, and the open lower end 135 of the reaction tube is closed hermetically by the lid 144 as shown in FIG. 6. Subsequently, the interior of the reaction tube 131 is heated to a predetermined process temperature of, for example, 800° C. In the step of loading the wafers W into the reaction tube 131 and the step of heating the interior of the reaction tube 131, nitrogen gas containing a small amount of oxygen gas is supplied through a nitrogen gas supply pipe, not shown, into the reaction tube 131. After the interior of the reaction tube 131 has been heated at the process temperature, the supply of nitrogen gas is stopped and the gas remaining in the reaction tube 131 is discharged through the exhaust pipe 130 by an evacuating device, not shown, to evacuate the reaction tube 131 to a low negative pressure. An oxidation process is started after the temperature of the wafers W has stabilized.

The heating unit 102 disposed outside the vertical thermal processing unit 101 is energized to heat the interior of the heating pipe 121 to, for example, 1000° C. The valve $V_0$ is opened to pass a process gas containing oxygen gas and hydrogen chloride gas through the heating pipe 121. The process gas is heated at about 1000° C. as the same flows through gaps between the transparent quartz beads 120 touching the transparent quartz beads 120. It is considered that the oxygen gas and the hydrogen chloride gas of the process gas may undergo chemical reactions expressed by the following reaction formulas, and that a very small amount of steam on the order of several hundreds parts per million may be generated.

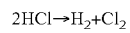

$2HCl \rightarrow H_2 + Cl_2$

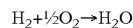

$H_2 + \tfrac{1}{2}O_2 \rightarrow H_2O$

The thus heated process gas flows through a part of the gas supply pipe 105 connected to the thermal processing furnace 103 and a part of the same extended along the inner surface of the liner tube 133 and flows into an upper part of the reaction tube 131. Then, the process gas flows through the holes 131b into a processing region in the reaction tube 131, and is discharged through the exhaust pipe 130 connected to a lower part of the reaction tube 131. The process gas flows into spaces between the stacked wafers W. The oxygen gas contained in the process gas oxidizes the silicon layers on the surfaces of the wafers W to form silicon dioxide films. Steam contained in the process gas of a small concentration promotes the formation of the silicon dioxide films.

The silicon dioxide film forming system in the second embodiment is capable of forming silicon dioxide films, each having a high intrasurface thickness uniformity and a high interwafer thickness uniformity. This may be considered to be due to the following reasons.

The process gas, i.e., a mixture of oxygen gas and hydrogen chloride gas, is heated by the heating unit 102 to, for example, about 1000° C., so that steam is generated. The temperature of the process gas slightly drops while the process gas is flowing through the gas supply pipe 105 after being heated. However, the amount of thus generated steam does not decrease even if the temperature of the process gas drops; that is, equilibrium of the chemical reaction of oxygen and hydrogen to produce steam does not shift toward the side of the product. Therefore, process gas does not produce steam any further in the reaction tube 131 after steam has been produced at a temperature higher than the process temperature in the reaction tube 131.

Thus, the generation of steam has been substantially terminated before the process gas flows into spaces between the wafers W held on the wafer boat 104. Therefore, the amount of steam contained in the process gas flowing from the periphery toward the center of each wafer W remains substantially constant regardless of position thereof, and hence the film formation promoting effect of steam on all parts of the surfaces of the wafers W held in an upper part of the wafer boat 104 is substantially the same. Consequently, a film having a high intrasurface thickness uniformity can be formed.

When the process gas is supplied by the conventional process gas supplying method, the generation of steam increases progressively toward the lower part of the wafer boat 104, and hence films of unsatisfactory intrasurface thickness uniformity are formed on the wafers W held in the upper part of the wafer boat 104 while films of higher intrasurface thickness uniformity are formed on the wafers W held in the lower part of the wafer boat 104. When the process gas is supplied by a process gas supplying method according to the present invention, an atmosphere that has been created by the conventional process gas supplying method in a lower part of the wafer boat 104 can be created in both upper and lower parts of the wafer boat 104. Consequently, films can be formed on the wafers W held on the wafer boat 104 in high interwafer thickness uniformity.

More strictly, it is considered that the steam concentration of the process gas decreases as the process gas flows toward the center of the wafer W because the steam contributes to the promotion of film formation. However, as mentioned above, the temperature of a central part of the wafer W is higher than that of a peripheral part of the same, and hence there is a tendency for the thickness of the film formed on the wafer W to increase from the periphery toward the center of the wafer W. The relatively high film formation promoting effect of steam around the periphery of the wafer W contributes to increasing the thickness of a part of the film on the peripheral part of the wafer W and, consequently, the intrasurface thickness uniformity of the film may be further improved.

The effect of progressive steam generation in the reaction tube 103 on the intrasurface thickness uniformity and the interwafer thickness uniformity is greater under lower temperatures. Thus, the second embodiment can greatly contribute to the reduction of the process temperature.

A compound gas containing hydrogen and chlorine other than the hydrogen chloride gas may be used. For example, dichlorosilane gas ($SiH_2Cl_2$ gas) may be used instead of the hydrogen chloride gas. The step of producing water by supplying energy to the process gas is not limited to the step of heating the process bas by the heating unit 102. Water may be produced by a step wherein the process gas is activated by supplying energy to the process gas with, for example, power of microwaves or a laser beam. In that case too, preferably, steam is generated in advance before the process gas is supplied into the reaction tube such that steam is not generated any further after the process gas has been supplied into the reaction tube.

The oxidation process for oxidizing wafers in the reaction vessel may be carried out by a single-wafer thermal processing system, instead of a batch thermal processing system.

Results of experimental film forming operations with the foregoing silicon dioxide film forming system will be described hereinafter.

(Experiment 1)

Silicon dioxide films were formed on the surfaces of 20 cm diameter wafers under the following process conditions, respectively.

Temperature in reaction tube: 800° C.
Flow rate of gases: $O_2/HCl=10/0.5$ slm
Processing time: 90 min
Temperature of heating unit: 1000° C.
Number of wafers on wafer boat: 100
Pressure in reaction tube: −49 Pa (−5 $mmH_2O$)

The thickness of silicon oxide films formed on the wafers in upper, middle and lower parts, respectively, of the wafer boat was measured to examine the intrasurface thickness uniformity of the silicon dioxide films. In addition, silicon dioxide films were formed on the surfaces of wafers under process conditions similar to the foregoing process conditions, except that the heating element of the heating unit was not energized. FIG. 9 shows the measured results. Intrasurface thickness uniformity is represented by a value calculated by using:

[{(Maximum thickness)−(Minimum thickness)}/2× (Mean thickness)]×100 (%)

As obvious form FIG. 9, supplying the process gas after heating the same into the reaction tube improves the intrasurface thickness uniformity of the silicon dioxide films formed on the wafers in the upper and the middle parts of the wafer boat and improves the interwafer thickness uniformity as well.

(Experiment 2)

Silicon dioxide films were formed on the surfaces of 20 cm diameter wafers under the following process conditions, respectively.

Temperature in reaction tube: 800° C.
Flow rate of gases: $O_2/HCl=10/0.3$ slm
Temperature of heating unit: 1000° C.
Number of wafers on wafer boat: 100
Pressure in reaction tube: −49 Pa (−5 $mmH_2O$)
Processing time: 2, 15, 30, and 60 min Intrasurface thickness uniformity of the wafers held in a middle part of the wafer boat was examined. Interwafer thickness uniformity was also examined. FIG. 10 shows the results of examinations. Interwafer thickness uniformity is represented by a value calculated by using:

(A/2×B)×100 (%)

where A is the difference between the maximum and the minimum among the respective mean thicknesses of the silicon dioxide films formed on the wafers held on the wafer boat (practically, a predetermined number of monitor wafers held on the wafer boat) and B is the mean of the respective mean thicknesses of the silicon dioxide films formed on the wafers.

As obvious from FIG. 10, the longer the processing time, i.e., the greater the film thickness, the greater is the effect on the improvement of the intrasurface thickness uniformity and the interwafer thickness uniformity. Especially, the intrasurface thickness uniformity and the interwafer thickness uniformity may be improved even in a thin range of about 3 nm of the film thickness.

(Experiment 3)

An empty wafer boat was loaded into the reaction tube, the interior of the reaction tube was heated to 800° C., and oxygen gas and hydrogen chloride gas were supplied at 10 slm and 1 slm, respectively. The hydrogen concentration of the gas discharged through the exhaust pipe was measured while the system was operating in an operating mode with the heating element energized to heat the process gas at 1000° C. and in an operating mode with the heating element not energized.

FIG. 11 shows the measured results, in which preparatory time signifies a length of time for which the gas was supplied before starting analysis. It is known from FIG. 11 that the hydrogen concentration of the discharged gas is small when the process gas is heated by the heating unit. It is inferred that the reaction: $H_2 + \frac{1}{2} O_2 \rightarrow H_2O$ is promoted when the process gas is heated.

A system for forming a silicon nitride film and a method of forming a silicon nitride film in a third embodiment according to the present invention will be described in connection with a batch-type vertical thermal processing system shown in FIG. 12.

Referring to FIG. 12, the thermal processing system 201 includes a substantially cylindrical reaction tube 202 disposed in a vertical posture. The reaction tube 202 is a double-wall structure consisting of an inner tube 203 defining a film forming space and an outer tube 204 having a closed upper end and surrounding the inner tube 203 so that an annular space of a predetermined thickness is formed between the inner tube 203 and the outer tube 204. The inner tube 203 and the outer tube 204 are made of a heat-resisting material, such as quartz (crystal).

A cylindrical manifold 205 made of a stainless steel (SUS) is disposed under the outer tube 204. A lower end of the outer tube 204 is joined hermetically to the manifold 205. The inner tube 203 is supported on a support ring 206, which is formed integrally with the manifold 205 and projecting from the inner circumference of the manifold 205.

A lid 207 is disposed below the manifold 205. A boat elevator 208 is adapted to move the lid 207 vertically. When the lid 207 is raised by the boat elevator 208, an open lower end of the manifold 205 is closed.

A wafer boat 209 made of, for example, quartz is mounted on the lid 207. The wafer boat 209 can hold a plurality of objects to be processed, such as semiconductor wafers 210, at predetermined vertical intervals of, for example, 10.4 mm.

A heat insulating member 211 surrounds the reaction tube 202. A reaction tube heater 212, such as a resistance-heating element, is provided on an inner circumference of the heat insulating member 211.

A plurality of gas supply pipes are connected to a side wall of the manifold 205. In the third embodiment, a first gas supply pipe 213 and a second gas supply pipe 214 are connected to the side wall of the manifold 205.

The first gas supply pipe 213 opens into a space defined by the inner tube 203. For example, the first gas supply pipe 213 is connected to a part of the side wall of the manifold 205 below the support ring 206, i.e., below the level of the lower end of the inner tube 203. A silane gas, such as disilane gas ($Si_2H_6$ gas), is adapted to be supplied through the first gas supply pipe 213 into the space defined by the inner tube 203.

The second gas supply pipe 214 opens into the space defined by the inner tube 203. Similarly to the first gas supply pipe 213, the second gas supply pipe 214 is connected to a part of the side wall of the manifold 205 below the support ring 206, i.e., below the level of the lower end of the inner tube 203. Trimethylamine gas (TMA gas) as a nitrogen source is adapted to be supplied through the second gas supply pipe 214 into the space defined by the inner tube 203.

A heating unit 215 provided with, for example, a resistance heating element is combined with the second gas supply pipe 214. The heating unit 215 is adapted to heat trimethylamine gas that flows through the heating unit 215 to a predetermined temperature. The heated trimethylamine gas flows through the second gas supply pipe 214 into the reaction tube 202.

Figures 13, 14:
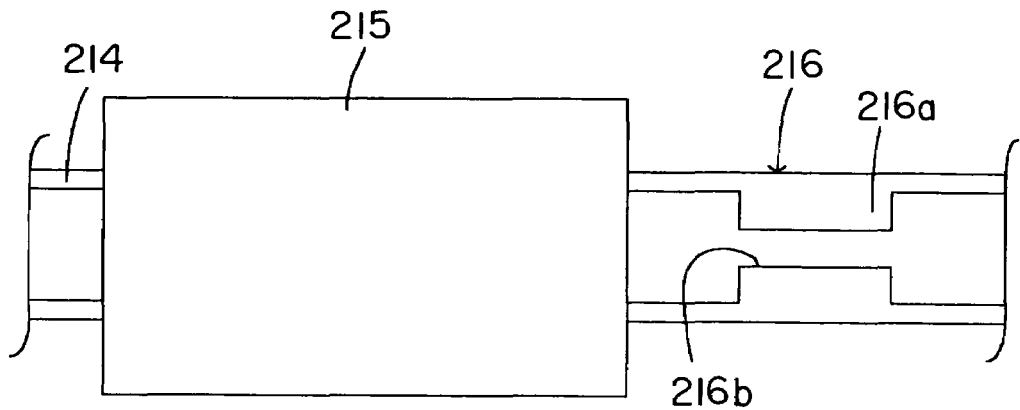
FIG. 13 is a typical view of a part of the film forming system of FIG. 12 in the vicinity of a gas heating unit.
FIG. 14 is a table showing deposition rates at which silicon nitride films were deposited and refractive indices of the silicon nitride films.
Figure 19A:
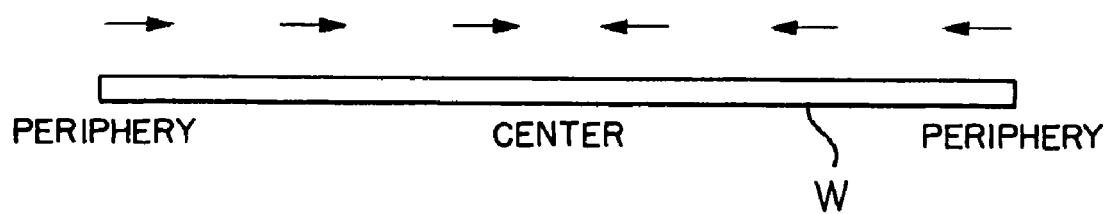
FIGS. 19A to 19C are schematic views explaining problems in a conventional silicon dioxide film forming method.
Figure 19B:
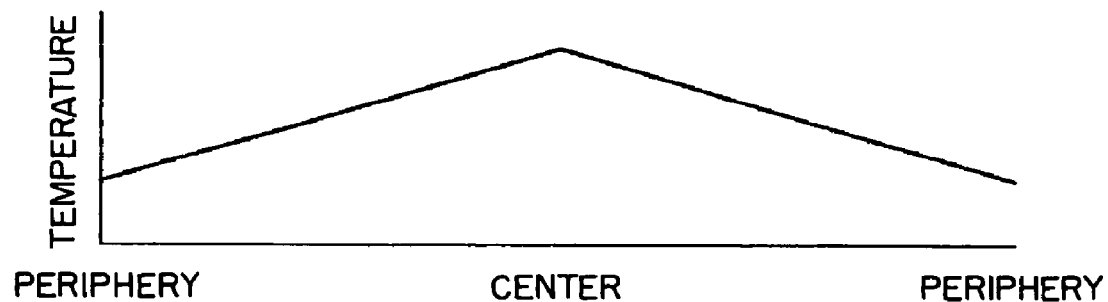
Figure 19C:
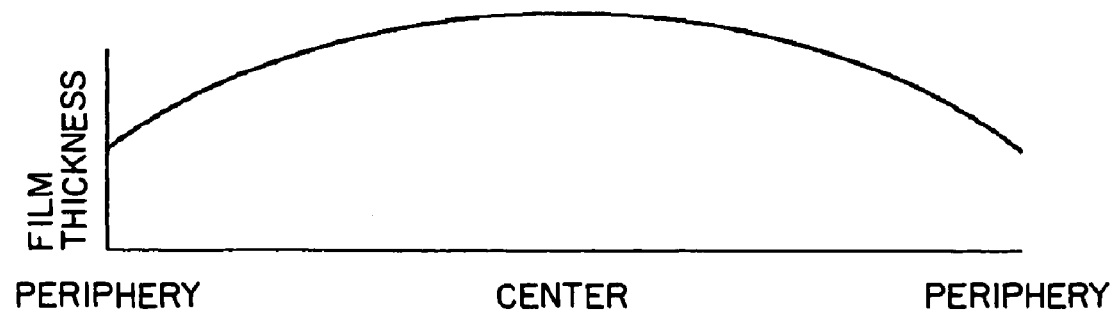

The second gas supply pipe 214 has a restricting part 216 in a part thereof on a downstream side of the heating unit 215. FIG. 13 is an enlarged view of a part of the second gas supply pipe 214 around the restricting part 216. As shown in FIG. 13, the restricting part 216 has a protrusion 216a defining an orifice 216b. The protrusion 216a protrudes from the inner circumference of the second gas supply pipe 214 so as to reduce the inside diameter of a section of the second gas supply pipe 214. The protrusion 216a has the shape of a round pipe. The inner circumference of the protrusion 216a defines the orifice 216b. In this embodiment, the inside diameter of the second gas supply pipe 214 is 20 mm and the diameter of the orifice 216b is about 0.6 mm.

A discharge port 217 is formed in a part of the side wall of the manifold 205 on a level above that of the support ring 206. The discharge port 217 opens into the annular space between the inner tube 203 and the outer tube 204 of the reaction tube 202. The process gases are adapted to be supplied through the first gas supply pipe 213 and the second gas supply pipe 214 into the inner tube 203 to carry out a film forming process. Reaction products produced by the film forming process flow through the annular space between the inner tube 203 and the outer tube 204 and are discharged through the discharge port 217.

An exhaust pipe 218 is connected hermetically to the discharge port 217. The exhaust pipe 218 is provided with a valve 219 and a vacuum pump 220. The opening of the valve 219 is regulated such that the interiors of the reaction tube 202 and the exhaust pipe 218 are maintained at predetermined pressures, respectively. The vacuum pump 220 evacuates the reaction tube 202 through the exhaust pipe 218 and operates so as to adjust the pressures in the reaction tube 202 and the exhaust pipe 218.

A controller 221 is connected to the boat elevator 208, the reaction tube heater 212, the first gas supply pipe 213, the second gas supply pipe 214, the heating unit 215, the valve 219 and the vacuum pump 220. The controller 221 may comprise a microprocessor, a process controller or the like. The controller 221 is adapted to measure temperatures and pressures of predetermined parts of the thermal processing system 201, and provide control signals or the like to the aforesaid components on the basis of measured data to control them.

A silicon nitride film forming method that uses the thermal processing system 201 will be described as applied to forming silicon nitride films on semiconductor wafers 210. With respect to the following description, the controller 221 controls operations of the aforesaid components of the thermal processing system 201.

The boat elevator 208 lowers the lid 207, and the wafer boat 209 holding the semiconductor wafers 210 is placed on the lid 207. Then, the boat elevator 208 raises the lid 207 to load the wafer boat 209 holding the semiconductor wafers 210 into the reaction tube 202. Thus, the semiconductor wafers 210 are held (contained) inside the inner tube 203 of the reaction tube 202 and the reaction tube 202 is sealed.

The reaction tube heater 212 heats the interior of the reaction tube 202 to a predetermined temperature. Preferably, the temperature to which the interior of the reaction tube 202 is heated is lower than a temperature in a range of 650 to 700° C. to which the conventional reaction tube has been heated, and suitable for forming a silicon nitride film. In detail, the temperature is preferably in a range of for example 400 to 650° C. In the third embodiment, the interior of the reaction tube 202 is heated at 550° C.

The heating unit 215 is heated to a predetermined temperature by a heater, not shown. The temperature to which the heating unit 215 is heated is a temperature capable of preheating trimethylamine, which has a large heat capacity and hence a difficulty to heat, so that the trimethylamine can be pyrolyzed and can supply nitrogen when heated in the reaction tube 202. Preferably, the heating unit 215 is heated to a temperature in a range of 500 to 700° C. The trimethylamine can not be satisfactorily heated if the temperature of the heating unit 215 is below 500° C., and the trimethylamine is pyrolyzed substantially completely by the heating unit 215 if the heating unit 215 is heated to 700° C. In the third embodiment, the heating unit 215 is heated at 550° C.

After the reaction tube 202 has been sealed, the opening of the valve 219 is controlled and the vacuum pump 220 is operated to start evacuating the reaction tube 202. The reaction tube 202 is evacuated until the pressure in the reaction tube 202 is reduced from the atmospheric pressure to a predetermined pressure, such as 127 Pa (0.95 Torr).

Preferably, the heating unit 215 is evacuated, for example, to a pressure in a range of 20 to 90 kPa (150 to 677 Torr). In the third embodiment, the heating unit 215 is evacuated to 84 kPa (630 Torr). Generally, pyrolyzing efficiency (heating efficiency) is apt to decrease under a reduced pressure. However, since the pressure in the heating unit 215 is higher than that in the reaction tube 202, the heating unit 215 is able to heat trimethylamine at a high heating efficiency.

While the pressure in the reaction tube 202 is maintained at 127 Pa (0.95 Torr), disilane is supplied through the first gas supply pipe 213 into the inner tube 203 at a predetermined flow rate of, for example, 0.025 l/min (25 sccm).

Trimethylamine is supplied through the second gas supply pipe 214 to the heating unit 215 at a predetermined flow rate of, for example, 1 l/min (1000 sccm). The heating unit 215 preheats the trimethylamine, and the preheated trimethylamine is supplied through the second gas supply pipe 214 into the inner tube 203.

Since the second gas supply pipe 214 has in the part thereof on the downstream side of the heating unit 215 the restricting part 216 having the orifice 216b, the trimethylamine stays in the heating unit 215 for a sufficiently long time. Thus, the heating unit 215 is able to heat the trimethylamine at a high heating efficiency.

The disilane and the trimethylamine supplied into the inner tube 203 flow over the semiconductor wafers 210 while heated and pyrolyzed. Then, the surfaces of the semiconductor wafers 210 are nitrided by the pyrolyzed process gas. That is, silicon nitride films are formed on the semiconductor wafers 210, respectively, after the process gas has been supplied into the reaction tube 202 for, for example, 120 min.

FIG. 14 shows deposition rate DR at which the silicon nitride films are deposited and refractive index RI of the silicon nitride films. Refractive index is an indicator of the composition (nitrogen content) of the formed silicon nitride film. A silicon nitride film having a substantially stoichiometric composition has RI=2.0. Deposition rate at which a silicon nitride film in a comparative example is deposited and refractive index of the silicon nitride film in the comparative example are shown also in FIG. 14 for reference. When forming the silicon nitride film in the comparative example, the heating unit 215 does not preheat trimethylamine.

As obvious from FIG. 14, the silicon nitride film forming method of the present embodiment is able to form a silicon nitride film of a substantially stoichiometric composition having a refractive index RI of 2.0, even if the temperature in the reaction tube 202 is 550° C., which is lower than 650° C. used by a conventional method. The silicon nitride film forming method of the present embodiment is able to form the silicon nitride film at a deposition rate of 0.70 nm/min, which is about 2.6 times as high as a deposition rate of 0.27 nm/min at which the silicon nitride film in the comparative example is formed.

Thus, the silicon nitride film of the substantially stoichiometric composition can be formed even though the process temperature of 550° C. in the reaction tube 202 is lower than 650° C. used by the conventional method. In addition, the silicon nitride film of the substantially stoichiometric composition can be deposited at the high deposition rate. These are because the trimethylamine after preheated by the heating unit 215 tends to be easily pyrolyzed when heated in the reaction tube 202 so that a larger amount of nitrogen is available.

Since the interior of the heating unit 215 is kept at 84 kPa (630 Torr), the heating efficiency of the heating unit 215 is improved. Consequently, the trimethylamine can be more easily pyrolyzed by heated in the reaction tube 202, a larger amount of nitrogen can be supplied, and the silicon nitride film of the substantially stoichiometric composition can be formed at a high deposition rate.

Since the second gas supply pipe 214 has in the part thereof on the downstream side of the heating unit 215 the restricting part 216 having the orifice 216b, the trimethylamine stays in the heating unit 215 for a sufficiently long time and, therefore, the heating unit 215 is able to heat the trimethylamine at a high heating efficiency. Consequently, the trimethylamine after preheated by the heating unit 215 is easily subject to pyrolysis when heated in the reaction tube 202 and a larger amount of nitrogen is supplied, so that the silicon nitride film of the substantially stoichiometric composition can be deposited at a high deposition rate.

After the silicon nitride films have been formed on the surfaces of the semiconductor wafers 210, respectively, the supply of the process gases through the first gas supply pipe 213 and the second gas supply pipe 214 is stopped. The gases remaining in the reaction tube 202 are discharged through the discharge port 217, and the interior of the reaction tube 202 is returned to the atmospheric pressure. Then, the boat elevator 208 unloads the wafer boat 209 holding the semiconductor wafers 210 from the reaction tube 202.

As apparent from the foregoing description, the silicon nitride film forming system in the third embodiment preheats the trimethylamine by means of the heating unit 215 capable of heating the trimethylamine at an improved heating efficiency, then the preheated trimethylamine is supplied into the reaction tube 202 to carry out a nitriding process. Therefore, even if the temperature in the reduction tube 202 is relatively low, a silicon nitride film of a substantially stoichiometric composition can be formed at a high deposition rate.

The following changes may be made in the silicon nitride film forming system in the third embodiment and the silicon nitride film forming method using the same silicon nitride film forming system.

Although the pressure of 84 kPa (630 Torr) in the heating unit 215 is higher than the pressure of 127 Pa (0.95 Torr) in the reaction tube 202 in the above embodiment, the pressure in the heating unit 215 and that in the reaction tube 202 may be allowed to be substantially equal.

Although the restrictor 216 having the orifice 216b is formed in the part on the downstream side of the heating unit 215 of the second gas supply pipe 214 in the above embodiment, any other flow restricting structure may be employed, to retard the passage of trimethylamine through the heating unit 215 instead of the restrictor 216. For example, the heating unit 215 may be provided with a long passage for trimethylamine to extend time necessary for trimethylamine to pass through the heating unit 215, which also improves the heating efficiency of the heating unit 215.

Although the diameter of the orifice 216b is about 0.6 mm in the above embodiment, the diameter of the orifice 216b is not limited thereto, may be any diameter such that trimethylamine can be made to stay for a sufficiently long time in the heating unit 215.

A silane gas is not limited to disilane gas; monosilane gas ($SiH_4$ gas) or dichlorosilane gas ($SiH_2Cl_2$ gas) may be used.

Although the thermal processing system in the above embodiment is the batch type vertical thermal processing system having the heating tube 202 of a double-wall structure consisting of the inner tube 203 and the outer tube 204, the present invention is applicable to various processing systems for forming a nitride film on an object to be processed. The object to be processed is not limited to a semiconductor wafer but may be, for example, a substrate for LCDs.

A system for forming a silicon dioxide film and a method of forming a silicon dioxide film in a fourth embodiment according to the present invention will be described in connection with a batch-type vertical thermal processing system shown in FIG. 15.

Referring to FIG. 15, the thermal processing system 301 includes a substantially cylindrical reaction tube 302 disposed in a vertical posture. The reaction tube 302 is a double-wall structure consisting of an inner tube 303 defining a film forming space and an outer tube 304 having a closed upper end and surrounding the inner tube 303 so that an annular space of a predetermined thickness is formed between the inner tube 303 and the outer tube 304. The inner tube 303 and the outer tube 304 are made of a heat-resisting material, such as quartz (crystal).

A cylindrical manifold 305 made of a stainless steel (sus) is disposed under the outer tube 304. A lower end of the outer tube 304 is joined hermetically to the manifold 305. The inner tube 303 is supported on a support ring 306, which is formed integrally with the manifold 305 and projecting from the inner circumference of the manifold 305.

A lid 307 is disposed below the manifold 305. A boat elevator 308 is adapted to move the lid 307 vertically. When the lid 207 is raised by the boat elevator 308, an open lower end of the manifold 305 is closed.

A wafer boat 309 made of, for example, quartz is mounted on the lid 307. The wafer boat 309 can hold a plurality of objects to be processed, such as semiconductor wafers 310, at predetermined vertical intervals of, for example, 5.2 mm.

A heat insulating member 311 surrounds the reaction tube 302. A reaction tube heater 312, such as a resistance-heating element, is provided on an inner circumference of the heat insulating member 311. The reaction tube heater 312 is adapted to set the interior of the reaction tube 302 at a predetermined temperature.

A plurality of gas supply pipes are connected to a side wall of the manifold 305. In the fourth embodiment, a first gas supply pipe 313 and a second gas supply pipe 314 are connected to the side wall of the manifold 305.

The first gas supply pipe 313 opens into a space defined by the inner tube 303. For example, the first gas supply pipe 313 is connected to a part of the side wall of the manifold 305 below the support ring 306, i.e., below the level of the lower end of the inner tube 303, as shown in FIG. 15. A silane gas, such as dichlorosilane gas ($SiH_2Cl_2$ gas), is adapted to be supplied through the first gas supply pipe 313 into the space defined by the inner tube 303.

The second gas supply pipe 314 opens into the space defined by the inner tube 303. Similarly to the first gas supply pipe 313, the second gas supply pipe 314 is connected to a part of the side wall of the manifold 305 below the support ring 306, i.e., below the level of the lower end of the inner tube 303. Dinitrogen oxide gas ($N_2O$ gas) is adapted to be supplied through the second gas supply pipe 314 into the space defined by the inner tube 303.

A heating unit 315 provided with, for example, a resistance heating element is combined with the second gas supply pipe 314. The heating unit 315 is adapted to heat dinitrogen oxide gas that flows through the heating unit 315 to a predetermined temperature. The heated dinitrogen oxide gas flows through the second gas supply pipe 314 into the reaction tube 302.

The second gas supply pipe 314 has a restricting part 316 in a part thereof on a downstream side of the heating unit 315. FIG. 16 is an enlarged view of a part of the second gas supply pipe 214 around the restricting part 216. As shown in FIG. 16, the restricting part 316 has a protrusion 316a defining an orifice 316b. The protrusion 316a protrudes from the inner circumference of the second gas supply pipe 314 so as to reduce the inside diameter of a section of the second gas supply pipe 314. The protrusion 316a has the shape of a round pipe. The inner circumference of the protrusion 316a defines the orifice 316b. In this embodiment, the inside diameter of the second gas supply pipe 314 is 20 mm and the diameter of the orifice 316b is about 0.6 mm.

A discharge port 317 is formed in a part of the side wall of the manifold 305 on a level above that of the support ring 306. The discharge port 317 opens into the annular space between the inner tube 303 and the outer tube 304 of the reaction tube 302. The process gases are adapted to be supplied through the first gas supply pipe 313 and the second gas supply pipe 314 into the inner tube 303 to carry out a film forming process. Reaction products produced by the film forming process flow through the annular space between the inner tube 303 and the outer tube 304 and are discharged through the discharge port 317.

An exhaust pipe 318 is connected hermetically to the discharge port 317. The exhaust pipe 318 is provided with a valve 319 and a vacuum pump 320. The opening of the valve 319 is regulated such that the interiors of the reaction tube 302 and the exhaust pipe 318 are maintained at predetermined pressures, respectively. The vacuum pump 320 evacuates the reaction tube 302 through the exhaust pipe 318 and operates so as to adjust the pressures in the reaction tube 302 and the exhaust pipe 318.

A controller 321 is connected to the boat elevator 308, the reaction tube heater 312, the first gas supply pipe 313, the second gas supply pipe 314, the heating unit 315, the valve 319 and the vacuum pump 320. The controller 321 may comprise a microprocessor, a process controller or the like. The controller 321 is adapted to measure temperatures and pressures of predetermined parts of the thermal processing system 301, and provide control signals or the like to the aforesaid components on the basis of measured data to control them.

A silicon dioxide film forming method that uses the thermal processing system 301 will be described as applied to forming silicon dioxide films on semiconductor wafers 310. With respect to the following description, the controller 321 controls operations of the aforesaid components of the thermal processing system 301.

The boat elevator 308 lowers the lid 307, and the wafer boat 309 holding the semiconductor wafers 310 is placed on the lid 307. Then, the boat elevator 308 raises the lid 307 to load the wafer boat 309 holding the semiconductor wafers 310 into the reaction tube 302. Thus, the semiconductor wafers 310 are held (contained) inside the inner tube 303 of the reaction tube 302 and the reaction tube 302 is sealed.

The reaction tube heater 312 heats the interior of the reaction tube 302 to a predetermined temperature suitable for forming a silicon dioxide film in a range of, for example, 700 to 900° C.

The heating unit 315 is heated to a predetermined temperature by a heater, not shown. The relation between the temperature of the heating unit 315 and the amount of oxygen that is produced through the pyrolysis of dinitrogen oxide was examined to find a suitable temperature to which the heating unit 315 is heated. FIG. 17 shows temperatures of the heating unit 315 and oxygen concentrations respectively corresponding to the temperatures. It is known from FIG. 17 that the oxygen concentration of the pyrolyzed gas is large when the temperature is 700° C. or above. The pyrolyzed gas having a large oxygen concentration promotes the oxidation of dichlorosilane supplied through the first gas supply pipe 313. Thus, it is preferable that the heating unit 315 is heated to 700° C. or above.

The amount of oxygen produced by the pyrolysis increases sharply when the temperature of the heating unit 315 is 750° C. or above. Therefore, it is particularly preferable to heat the heating unit 315 to 750° C. or above. However, dinitrogen oxide is pyrolyzed substantially completely when heated at 950° C. Therefore, oxygen concentration does not increase beyond the oxygen concentration at 950° C. even if dinitrogen oxide is heated to a temperature beyond 950° C. Thus, it is particularly preferable that the temperature of the heating unit 315 is in a range of 750 to 950° C.

After the reaction tube 302 has been sealed, the opening of the valve 319 is controlled and the vacuum pump 320 is operated to start evacuating the reaction tube 302. The reaction tube 302 is evacuated until the pressure in the reaction tube 302 is reduced from the atmospheric pressure to a predetermined pressure, such as 47 Pa (0.35 Torr).

The heating unit 315 is evacuated, for example, to a pressure in a range of 0.1 to 90 kPa (0.75 to 677 Torr). In the fourth embodiment, the heating unit 315 is evacuated to 85 kPa (640 Torr). Generally, pyrolyzing efficiency (heating efficiency) is apt to decrease under a reduced pressure. However, since the pressure in the heating unit 315 is higher than that in the reaction tube 302, the heating unit 315 is able to heat dinitrogen oxide at an improved heating efficiency.

While the pressure in the reaction tube 302 is maintained at 47 Pa (0.35 Torr), dichlorosilane is supplied through the first gas supply pipe 313 into the inner tube 303 at a predetermined flow rate of, for example, 0.15 l/min (150 sccm).

Dinitrogen oxide gas is supplied through the second gas supply pipe 314 to the heating unit 315 at a predetermined flow rate of, for example, 0.3 l/min (300 sccm). The dinitrogen oxide gas is heated and pyrolyzed by the heating unit 315 to produce oxygen. The dinitrogen oxide gas containing the oxygen is supplied through the second gas supply pipe 314 into the inner tube 303.

Since the second gas supply pipe 314 has in the part thereof on the downstream side of the heating unit 315 the restricting part 316 having the orifice 316b, the dinitrogen oxide stays in the heating unit 315 for a sufficiently long time. Thus, the heating unit 315 is able to heat the dinitrogen oxide at a high heating efficiency and promote the pyrolysis of the dinitrogen oxide.

The oxygen supplied into the inner tube 303 oxidizes the dichlorosilane to produce silicon dioxide ($SiO_2$). Since the dinitrogen oxide is supplied into the inner tube 303 after heated at 700° C. or above, further heating the dinitrogen oxide in the inner tube 303 promotes the pyrolysis of the dinitrogen oxide. Consequently, the oxygen concentration of the gas in the inner tube 303 increases, the oxidation of the dichlorosilane supplied into the inner tube 303 can be promoted, and the production of silicon dioxide can be increased.

The produced silicon dioxide deposits on the semiconductor wafers 310. Silicon dioxide films are formed on the semiconductor wafers 310, respectively, after dichlorosilane and dinitrogen oxide have been supplied into the reaction tube 302 for a predetermined time of, for example, 60 min. Since the production of silicon dioxide is promoted, the silicon dioxide films can be deposited on the semiconductor wafers 310 at an increased deposition rate.

FIG. 18 shows deposition rates DR at which the silicon dioxide films were deposited when the heating unit 315 was heated at different temperatures. Deposition rate at which a silicon dioxide film was formed when dinitrogen oxide was not heated by the heating unit 315 is shown in FIG. 18 as a comparative example.

As obvious from FIG. 18, heating dinitrogen oxide to 700° C. or above by the heating unit 315 increases silicon dioxide film deposition rate; that is, the silicon dioxide film deposition rate increases according to the increase of the amount of oxygen produced by the pyrolysis of the dinitrogen oxide. Oxygen produced through the pyrolysis of the dinitrogen oxide promotes the oxidation of dichlorosilane, and the deposition rate of the silicon dioxide films formed on the semiconductor wafers 310 is increased.

Since dinitrogen oxide not pyrolyzed when heated by the heating unit 315 is at least preheated, the same is easily subject to pyrolysis when heated in the inner tube 303. Consequently, the dinitrogen oxide can be efficiently pyrolyzed. Thus, the dichlorosilane can be oxidized efficiently, and the silicon dioxide films can be formed on the semiconductor wafers 310 at an increased deposition rate.

The facts that heating dinitrogen oxide to 750° C. or above by the heating unit 315 increases silicon dioxide film deposition rate greatly and that silicon dioxide film deposition rate does not increase beyond a level achieved when dinitrogen oxide is heated at 950° C. even if dinitrogen oxide is heated to a temperature above 950° C. correspond to the variation of oxygen concentration with respect to the temperature of the heating unit 315 shown in FIG. 17. Thus, it is particularly preferable to heat dinitrogen oxide by the heating unit 315 to a temperature in a range of 750 to 950° C.

Since the interior of the heating unit 315 is kept at 84 kPa (630 Torr), the heating efficiency of the heating unit 315 is improved. Consequently, the pyrolysis of the dinitrogen oxide is promoted, and the silicon dioxide films can be formed at a high deposition rate.

Since the second gas supply pipe 314 has in the part thereof on the downstream side of the heating unit 315 the restricting part 316 having the orifice 316b, the dinitrogen oxide stays in the heating unit 315 for a sufficiently long time. Thus, the heating unit 315 is able to heat the dinitrogen oxide at a high heating efficiency. Consequently, the pyrolysis of the dinitrogen oxide is promoted, and the silicon dioxide film deposition rate can be enhanced.

After the silicon dioxide films have been formed on the surfaces of the semiconductor wafers 310, respectively, the supply of the process gases through the first gas supply pipe 313 and the second gas supply pipe 314 is stopped. The gases remaining in the reaction tube 302 are discharged through the discharge port 317, and the interior of the reaction tube 302 is returned to the atmospheric pressure. Then, the boat elevator 308 unloads the wafer boat 309 holding the semiconductor wafers 310 from the reaction tube 302.

As apparent from the foregoing description, the silicon dioxide film forming system in the fourth embodiment supplies dinitrogen oxide into the inner tube 303 after heating the same by means of the heating unit 315 to 700° C. or above. Therefore, the pyrolysis of the dinitrogen oxide is promoted, and the silicon dioxide film deposition rate can be enhanced.

The following changes may be made in the silicon dioxide film forming system in the fourth embodiment and the silicon dioxide film forming method using the same silicon dioxide film forming system.

A silane gas is not limited to dichlorosilane gas; monosilane gas ($SiH_4$ gas) or disilane gas ($Si_2H_6$ gas) may be used.

Although the pressure of 85 kPa (640 Torr) in the heating unit 315 is higher than the pressure of 47 Pa (0.35 Torr) in the reaction tube 302 in the above embodiment, the pressure in the heating unit 315 and that in the reaction tube 302 may be allowed to be substantially equal.

Although the diameter of the orifice 316b is about 0.6 mm in the above embodiment, the diameter of the orifice 316b is not limited thereto, may be any diameter such that dinitrogen oxide can be made to stay for a sufficiently long time in the heating unit 315. Although the restrictor 316 having the orifice 316b is formed in the part on the downstream side of the heating unit 315 of the second gas supply pipe 314 in the above embodiment, any other flow restricting structure may be employed to retard the passage of dinitrogen oxide through the heating unit 315 instead of the restrictor 316. For example, the heating unit 315 may be provided with a long passage for dinitrogen oxide to extend time necessary for dinitrogen oxide to pass through the heating unit 315, which also improves the heating efficiency of the heating unit 315.

Although the thermal processing system in the above embodiment is the batch type vertical thermal processing system having the heating tube 302 of a double-wall structure consisting of the inner tube 303 and the outer tube 304, the present invention is applicable to various processing systems for forming an oxide film on an object to be processed. The object to be processed is not limited to a semiconductor wafer but may be, for example, a substrate for LCDs.

As apparent from the foregoing description, one feature of the present invention enables to form a thin oxynitride film having a desired nitrogen content.

One feature of the present invention enables to form an oxide film having a high thickness uniformity by subjecting an object to be processed to a dry oxidation process, and enables the reduction of process temperature.

One feature of the present invention enables to form a silicon nitride film of a substantially stoichiometric composition at a low temperature at a high deposition rate.

One feature of the present invention enables to form a silicon dioxide film on an object to be processed at a high deposition rate.

What is claimed is:

1. A silicon dioxide film forming method comprising:
a reaction chamber heating step of heating a reaction chamber to a predetermined temperature, the reaction chamber containing an object to be processed having a surface provided with at least a silicon layer;
a gas pretreating step of energizing a process gas prior to reaching the reaction chamber to produce water, the process gas consisting of a hydrogen chloride gas and an oxygen gas; and
a film forming step of forming a silicon dioxide film by supplying the process gas that has been energized to produce water into the heated reaction chamber to oxidize the silicon layer of the object to be processed.

2. A silicon dioxide film forming method according to claim 1, wherein the water is produced in the gas pretreating step to an extent such that the process gas does not produce water any further at the temperature to which the reaction chamber is heated.

3. A silicon dioxide film forming method according to claim 1, wherein the process gas is energized to produce water by heating the process gas, in the gas pretreating step.

4. A silicon dioxide film forming method according to claim 3, wherein the process gas is heated to a temperature that is higher than the temperature at which the reaction chamber is heated in the reaction chamber heating step.

* * * * *